United States Patent [19]

Bapst

[11] Patent Number: 5,412,591
[45] Date of Patent: May 2, 1995

[54] SCHEMATIC COMPILER FOR A MULTI-FORMAT HIGH SPEED MULTIPLIER

[75] Inventor: Mark V. Bapst, Coral Springs, Fla.

[73] Assignee: VLSI Technology, Inc., San Jose, Calif.

[21] Appl. No.: 564,926

[22] Filed: Aug. 9, 1990

[51] Int. Cl.[6] .............................................. G06F 7/52
[52] U.S. Cl. .................................... 364/757; 364/489
[58] Field of Search ............... 364/754, 757, 758, 759, 364/760, 489, 490; 371/25.1, 26

[56] References Cited

U.S. PATENT DOCUMENTS

| | | | |
|---|---|---|---|
| 3,614,608 | 10/1971 | Giedd et al. | 371/25.1 |
| 4,285,059 | 8/1981 | Burlage et al. | 371/25.1 |
| 4,745,570 | 5/1988 | Diedrich et al. | 364/760 |
| 4,791,601 | 12/1988 | Tanaka | 364/760 |
| 4,839,848 | 6/1989 | Peterson et al. | 364/757 |
| 4,918,639 | 4/1990 | Schwarz et al. | 364/757 |
| 4,922,432 | 5/1990 | Kobayashi et al. | 364/490 |
| 4,965,741 | 10/1990 | Winchell et al. | 364/490 |
| 4,967,367 | 10/1990 | Piednoir | 364/489 |
| 5,005,136 | 4/1991 | Van Berkel et al. | 364/490 |
| 5,097,422 | 3/1992 | Corbin, II et al. | 364/488 |

OTHER PUBLICATIONS

A. Arya et al. "Automatic Generation of Digital System" IEEE, 22nd Design Automation Conference, Paper 24.4, 1985, pp. 388–395.

J. Nash et al. "A Front End Graphic Interface to the First Silicon Compiler", European Conference on Electronic Design Automation, 26–30 Mar. 1984, Publication No. 232, pp. 120–124.

Kai Hwang, *Computer Arithmetic: Principles, Architecture and Design.* New York: John Wiley & Sons, 1979, pp. 167–171, 179–183.

*Primary Examiner*—Tan V. Mai
*Attorney, Agent, or Firm*—Douglas L. Weller

[57] ABSTRACT

A multiplier compiler produces a schematic of a high-speed, multi-format multiplier. The compiler receives user information which indicates design preferences. Based on the user information the compiler can select the format of numbers which the multiplier will multiply and/or select a type of adder with which to implement the final adder row of the multiplier. The compiler generates user readable schematics of the multiplier. The schematic displays discrete components of the multiplier arranged in locations which show to the user the flow of logic of the circuit. Additionally, the compiler generates test vectors.

6 Claims, 13 Drawing Sheets

| FIGURE 1A |
|---|
| FIGURE 1B |

Figure 1

| FIGURE 2A |
|---|
| FIGURE 2B |

Figure 2

| FIGURE 8A | FIGURE 8B |
|---|---|

Figure 8

| FIGURE 9A |
|---|
| FIGURE 9B |

Figure 9

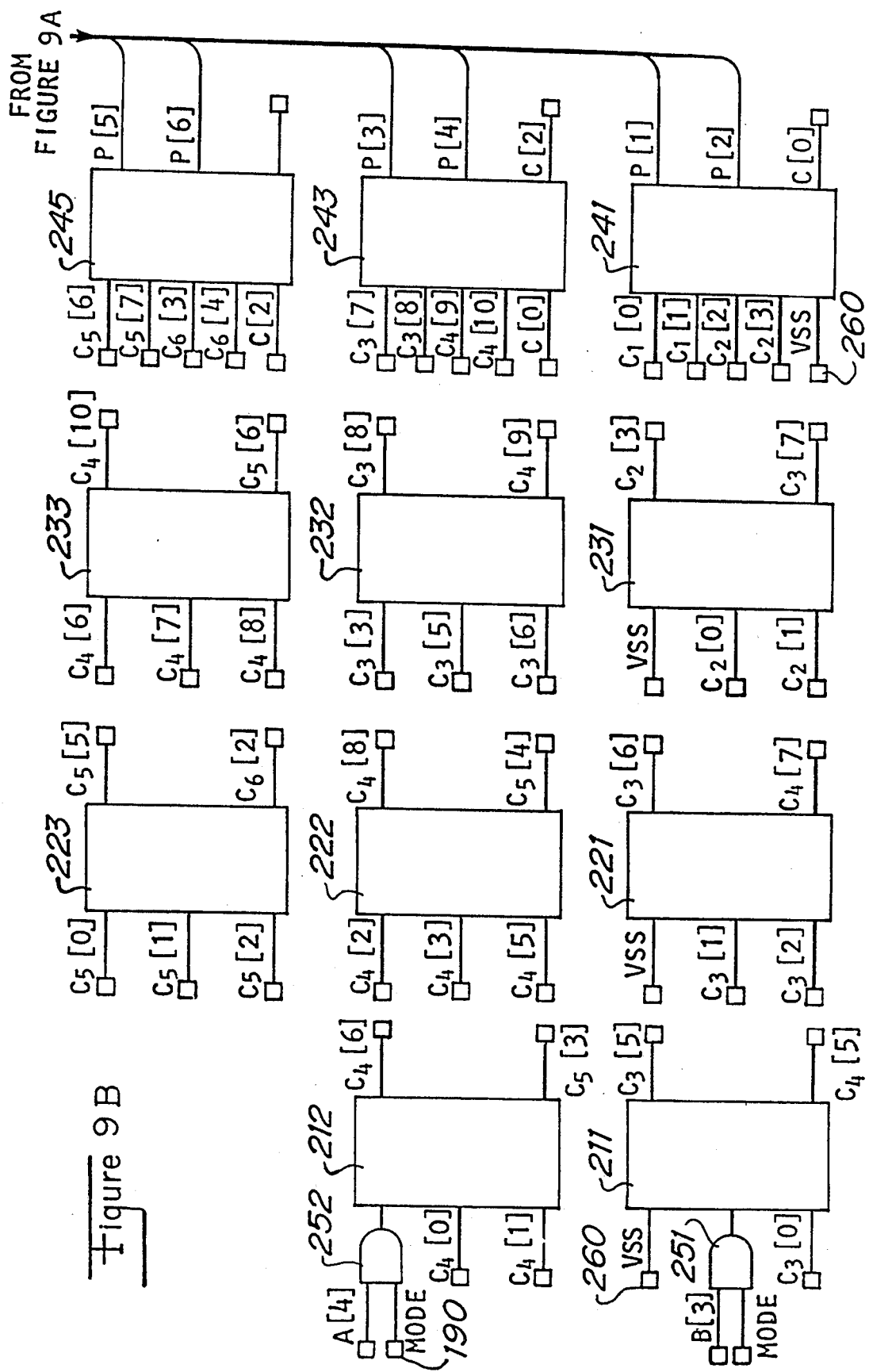

SCHEMATIC COMPILER FOR A MULTI-FORMAT HIGH SPEED MULTIPLIER

BACKGROUND

The present invention concerns the design of a high-speed, multi-format multiplier, and a multiplier compiler which produces a schematic of the high-speed, multi-format multiplier.

In the design of integrated circuits, synthesis tools and silicon compilers are often used. Based on specifications received from a designer, the synthesis tools, or synthesizers, generate netlists, while the silicon compilers generate "hard" layout of the integrated circuits. Netlists are textual lists of components and connections. Hard layouts show how the components may implemented in silicon. The netlists, once generated, and the hard layout, once generated, are extremely difficult to modify.

Compilers written to produce hardware multipliers have used a variety of algorithms. The goal of each algorithm is to produce a hardware multiplier which has a high circuit density and/or has high performance. The ideal, yet hard to attain, multiplier compiler produces a hardware multiplier which combines high performance while taking up a minimum of space on an integrated circuit.

One solution has been to provide a multiplier compiler which automatically inserts pipeline registers. In one embodiment of such a multiplier compiler, a user specifies the performance rate at which a multiplier is to receive multipliers and multiplicands and produce a product. The multiplier compiler will then produce a multiplier which inserts as many pipeline stages as necessary so that the specified performance rate can be met.

While such a multiplier compiler does facilitate the inclusion of a multiplier in a system which operates at a high frequency, there is no actual performance gain through the multiplier. For example, a combinatorial multiplier with a propagation delay of 50 nanoseconds can be retrofitted to a system with a 30 nanosecond clock rate by the insertion of one pipeline stage. The resultant multiplier will require two 30 nanosecond cycles to complete a multiplication rather than one 50 nanosecond cycle. Thus the overall computational performance of the multiplier is not improved.

An ideal multiplier compiler not only has the flexibility to allow a user to make performance versus chip density trade-offs, but also allows a user flexibility to, in the design of a multiplier, select the format of the multiplier and multiplicand which will be multiplied by the multiplier. Common formats include signed magnitude, unsigned magnitude and two's complement.

Once a multiplier has been included on an integrated circuit that is mass produced, each fabricated integrated circuit is tested to assure that a customer receives working parts. The multiplier is typically tested by applying test vectors to the input of the multiplier, each test vector including a multiplier and a multiplicand. The product for each test vector received from the multiplier is strobed and compared against the correct answer. A product incorrectly calculated by the multiplier indicates flawed circuitry. An integrated circuit containing a multiplier with flawed circuitry is discarded.

One approach to thoroughly test a multiplier is to have a test vector for every combination of multiplier and multiplicand. However, for even moderate size multipliers the required amount of test vectors is impractically high. For example, using such a system, a multiplier which multiplied two eight bit numbers would require 65,536 test vectors. A multiplier which multiplied two ten bit numbers would require 1,048,546 test vectors. Such a large number of test vectors increases the time required to test an integrated circuit, and thus increases the expense of performing testing.

Sets of test vectors may be generated with fewer test vectors in each set, however, it is difficult for a designer of test vectors who is not intimately acquainted with the design of a multiplier to specify an efficient set of test vectors which will thoroughly test a multiplier.

SUMMARY OF THE INVENTION

In accordance with the preferred embodiment of the present invention, a high-speed, multi-format multiplier, and a multiplier compiler which produces a schematic of the high-speed, multi-format multiplier are presented.

In one embodiment of the present invention, a two's complement multiplier includes a plurality of logical gates which are arranged to receive a multiplicand and a multiplier in two's complement format and to generate summands arranged in columns. Adders, organized in rows, each receive summands from a particular column and reduce the number of summands until there is a maximum of two summands per column. Each row of adders reduces a maximum number of summands in each column to a next lower predetermined number stage. In general, the lowest predetermined number stage is two and each predetermined number stage $S_j$, other than the lowest predetermined number stage, is calculated from a next lower number stage $S_{j-1}$ using the following formula: $S_j = S_{j-1} + \text{int}(S_{j-1}/2)$. A final adder row performs a final addition on the summands which remain after the summands have been reduced.

In another embodiment of the present invention it is possible to change the mode of the multiplier. For example, a multiplier may include a mode bit. When the mode bit is in a first state, a plurality of logical gates generates summands for multiplication of unsigned magnitude numbers. When the mode bit is in a second state, the plurality of logical gates generates summands for multiplication of two's complement numbers.

A compiler which is able to generate a multiplier according to the preferred embodiments of the present invention receives from a user information which indicates design preferences. For example, the compiler may receive multiplier selection information, often called a template. Based on the template the compiler selects, for instance, the format of numbers which the multiplier will multiply and the size of the multiplier and multiplicand. For example, the compiler may select a multiplier which will multiply numbers which are in unsigned magnitude format or in two's complement format.

Also the user information may include final adder row information. The compiler uses the final adder row information to select a type of adder with which to implement the final adder row. The final adder row may be implemented, for example, using ripple carry adders, carry look-ahead adders, or carry save adders. The final adder row information may include, for example a direct selection by the user of the type of adder with which to implement the final adder row. Alternately, the final adder row information may include parameters which indicate the desired performance rate of the multiplier. In this case, the compiler selects a type of adder for the final adder row which allows the multiplier to achieve the desired performance rate. A final adder row may account for as much as ninety percent of the total propagation delay of a multiplier; therefore, it is desirable to select the type of adders used in the final adder row based on the user's performance and size constraints.

Additionally, a compiler in accordance with a preferred embodiment of the present invention may generate test vectors. Utilizing the generated test vectors allows for efficient and complete testing of integrated circuits which include multipliers generated by the compiler.

In the preferred embodiment of the present invention, the compiler generates user readable schematics of the multiplier. The schematic displays discrete components of the multiplier arranged in locations which show to the user the flow of logic of the circuit. This facilitates modification and thus customization of the multiplier. Wire segments extending from the discrete components are labelled. The labelling shows the connectivity between the discrete components. Alternately, for example, in less complex designs, wires may be shown between discrete components.

Figure 2A:
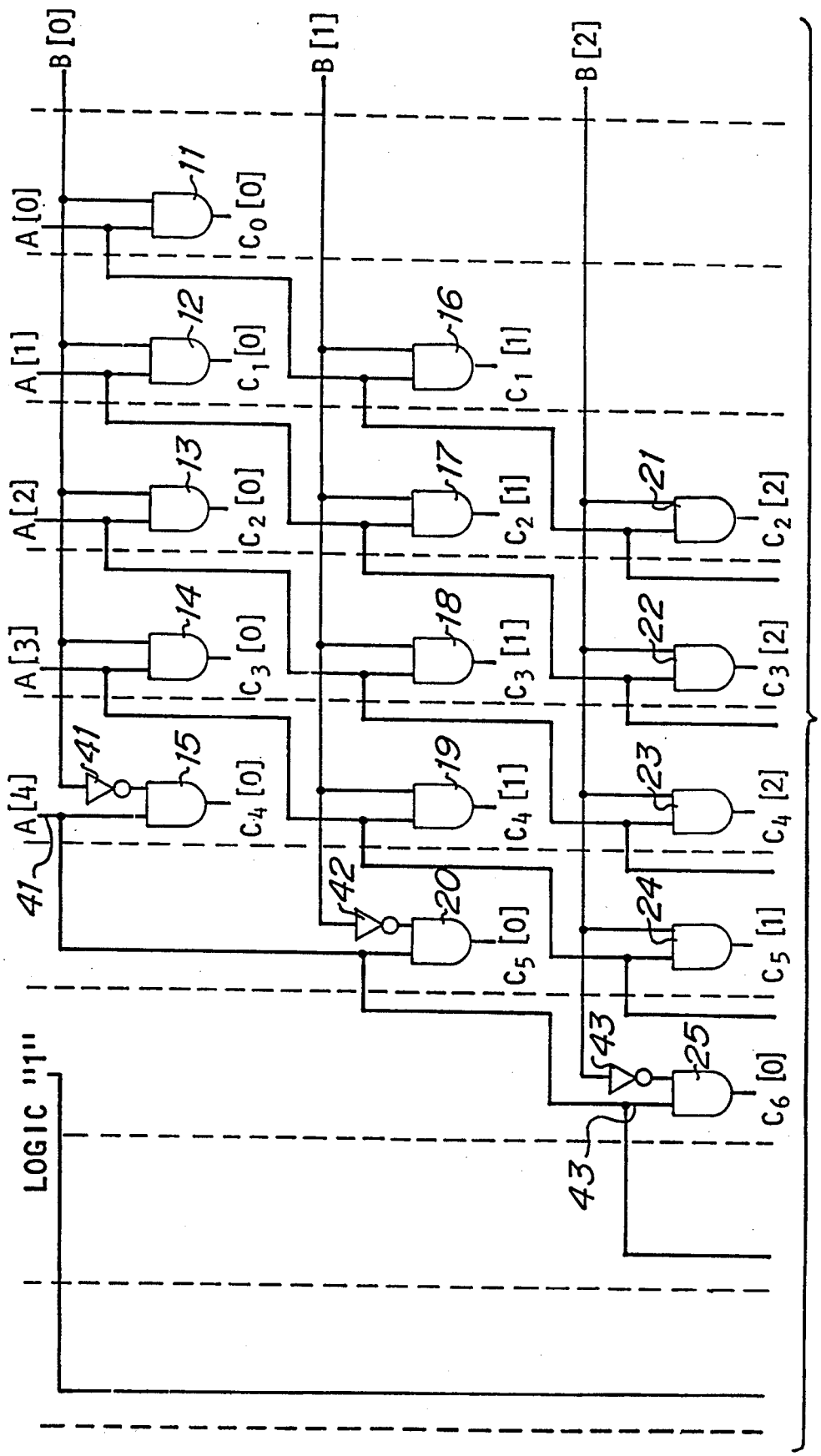
Figure 2B:
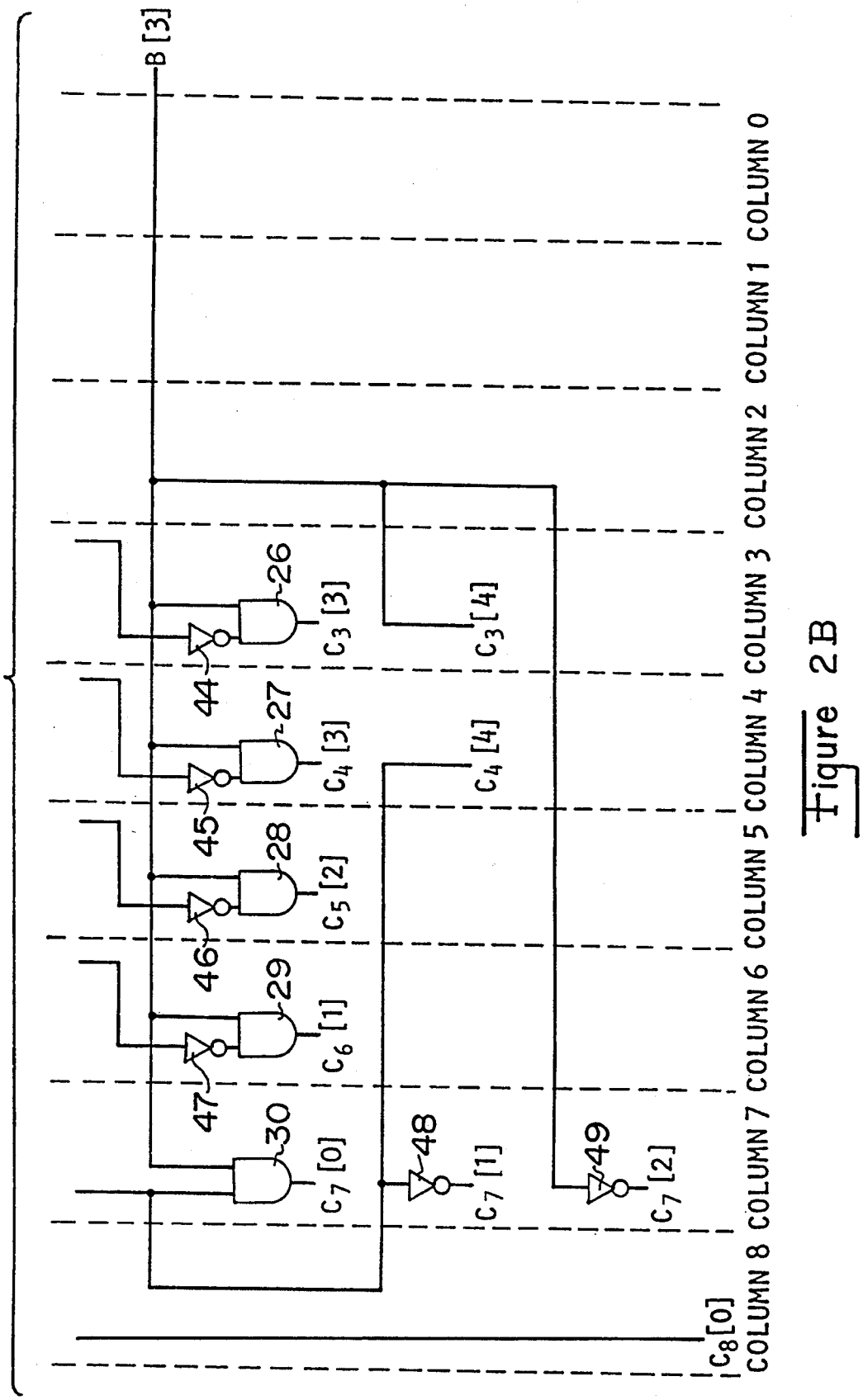

IFG. 2 (FIGS. 2A–2B) shows logical gates arranged to generate summands used in a multiplier which performs multiplication of two's complement numbers in accordance with a preferred embodiment of the present invention.

Figure 3:
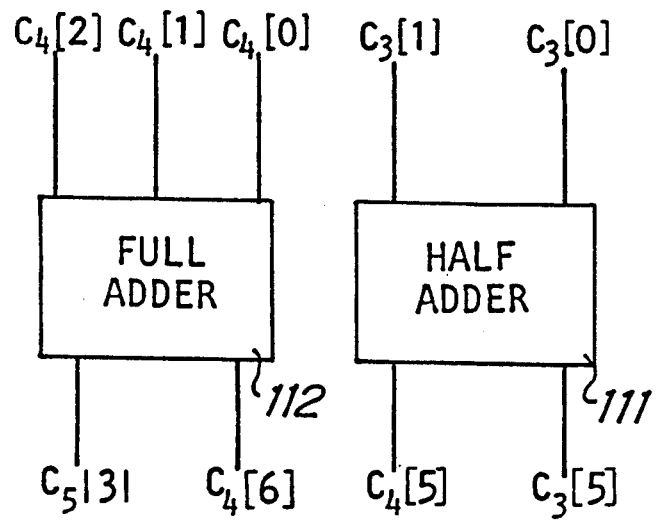
Figure 4:
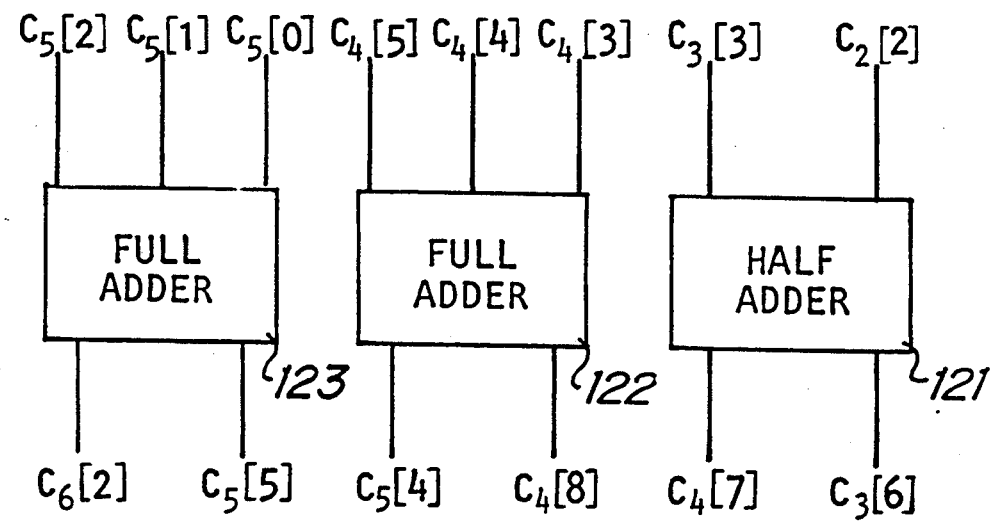
Figure 5:
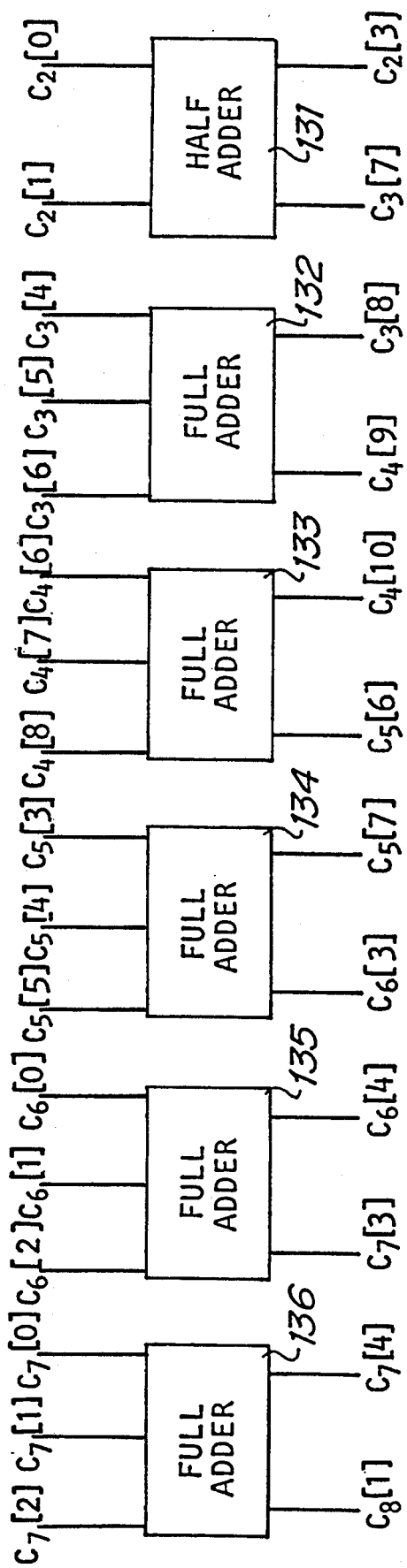

FIG. 3, FIG. 4 and FIG. 5 show adders arranged to reduce the numbers of summands produced by the logical gates shown in FIG. 2 in accordance with a preferred embodiment of the present invention.

Figure 6:
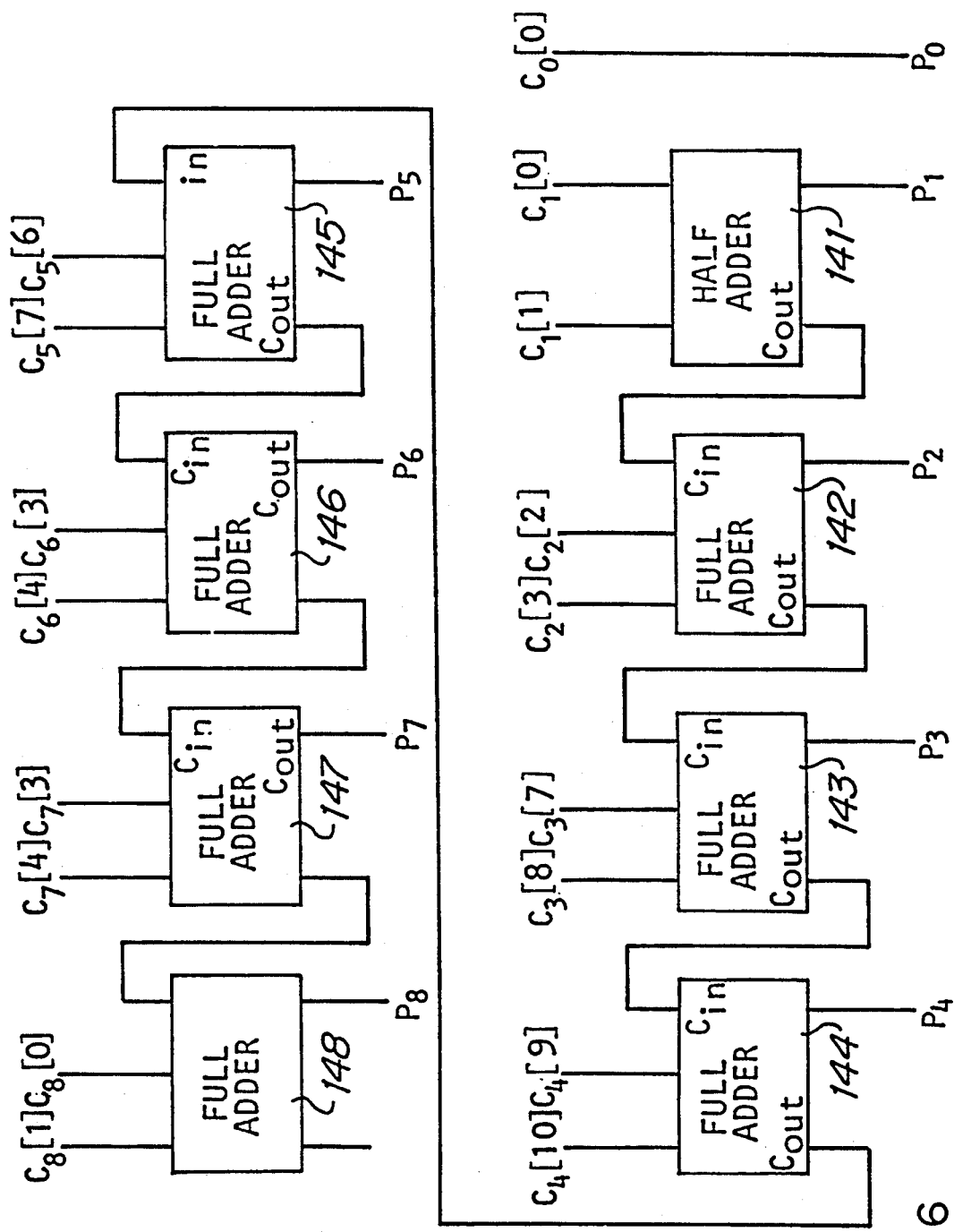

FIG. 6 shows an adder used to perform a final addition on the remaining summands after reduction by the adders shown in FIG. 3, FIG. 4 and FIG. 5 in accordance with a preferred embodiment of the present invention.

Figure 7:
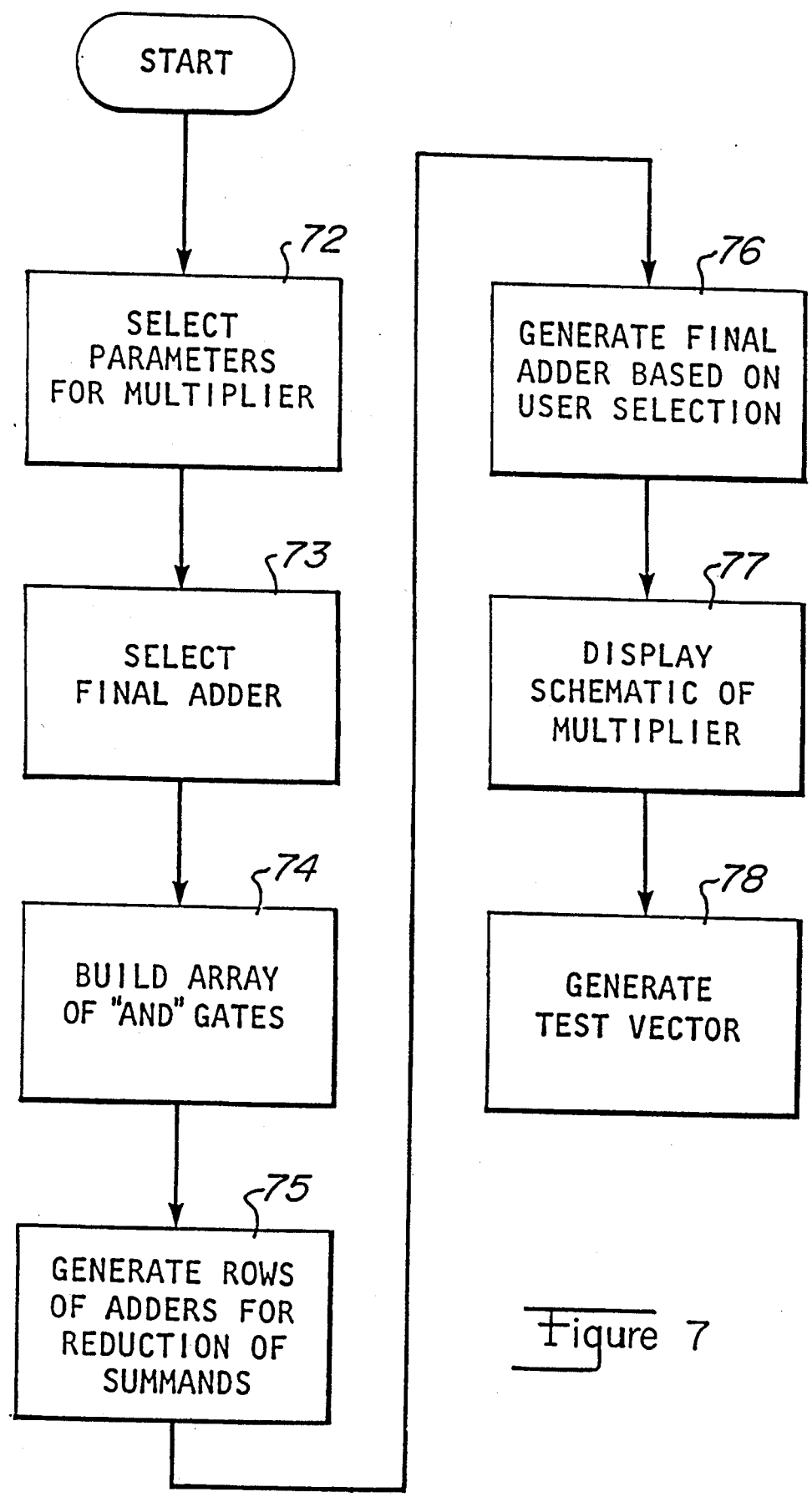

FIG. 7 shows a flowchart of a multiplier compiler which generates a high-speed, multi-format multiplier in accordance with the preferred embodiment of the present invention.

Figure 8A:
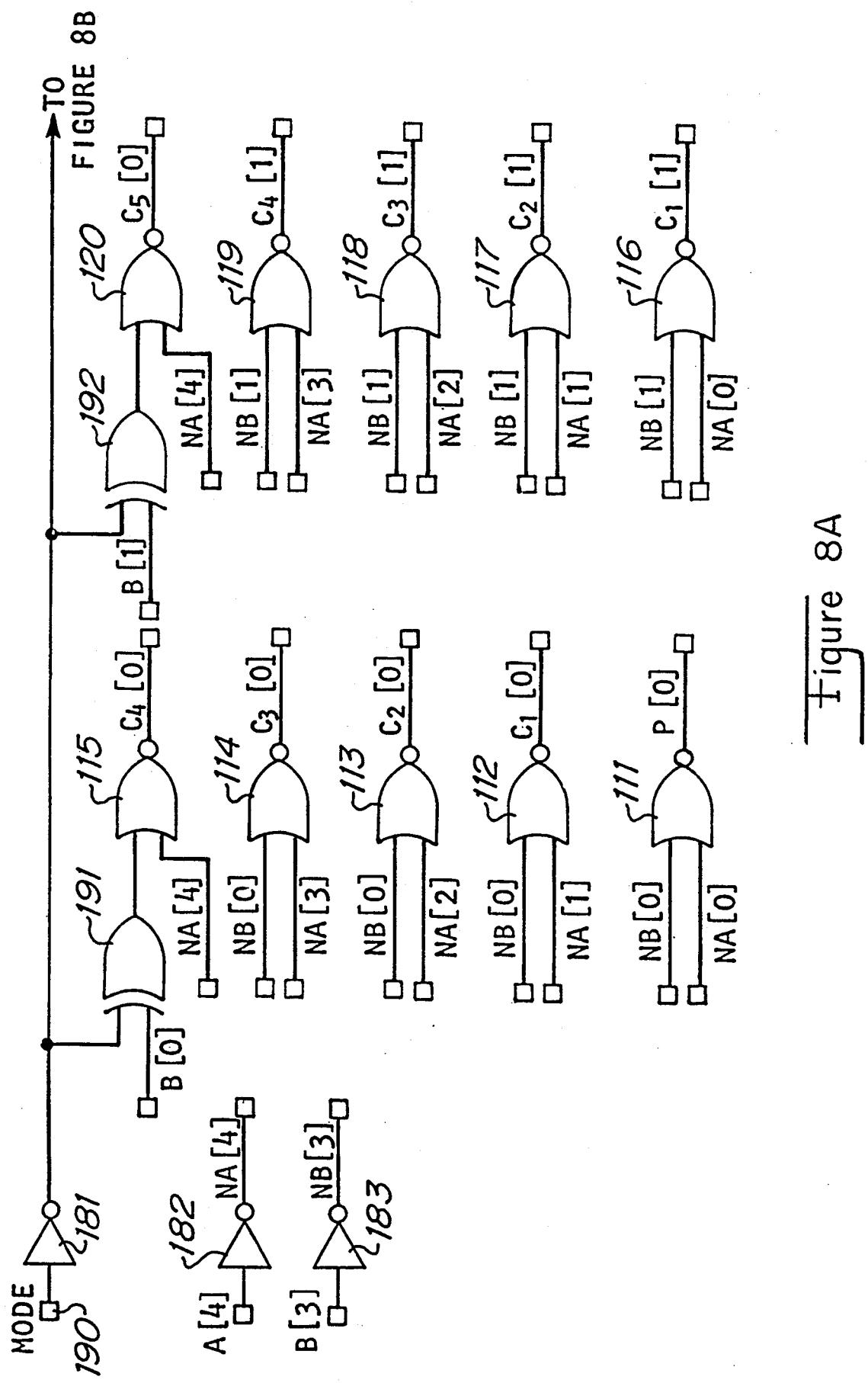
Figure 8B:
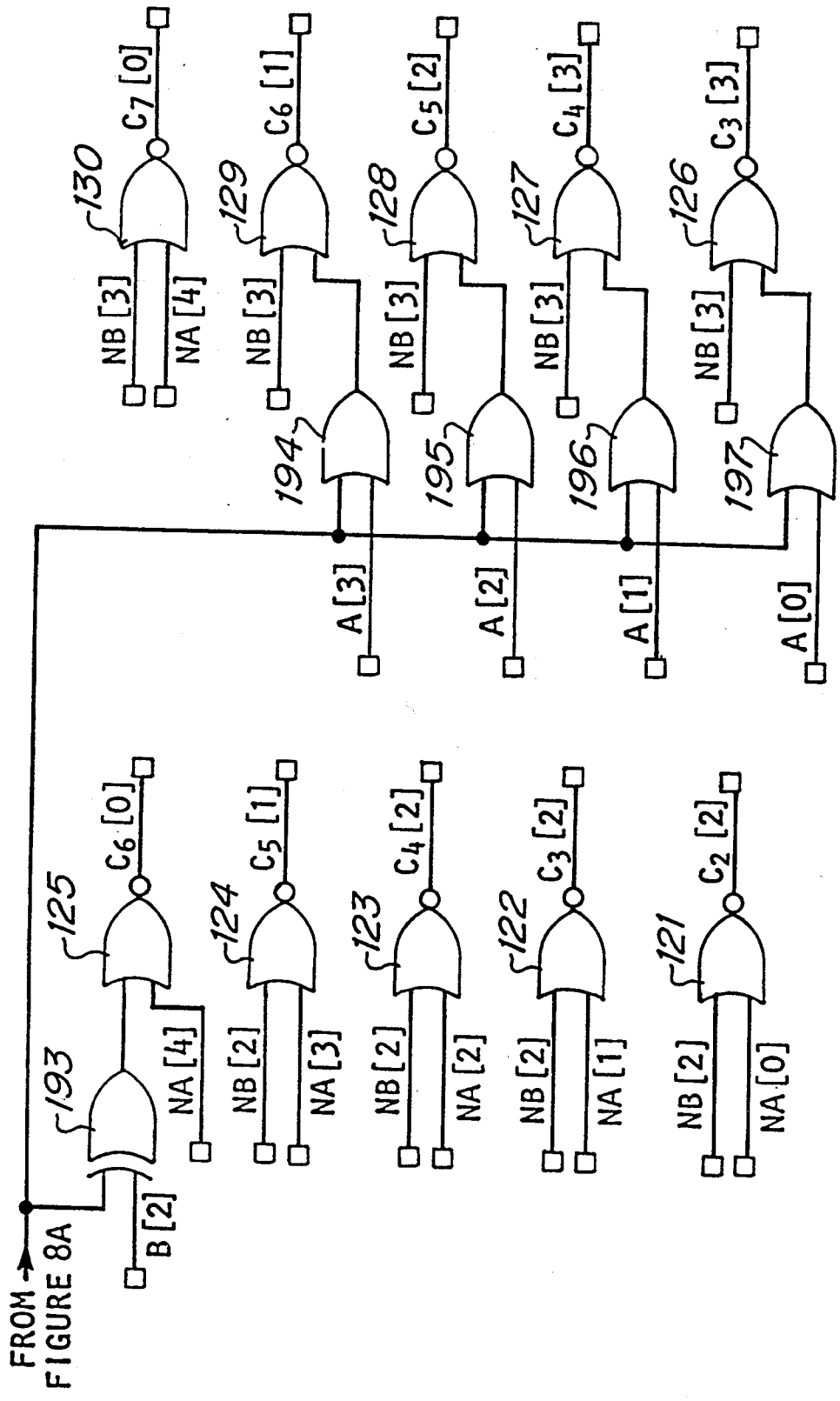
Figure 9A:
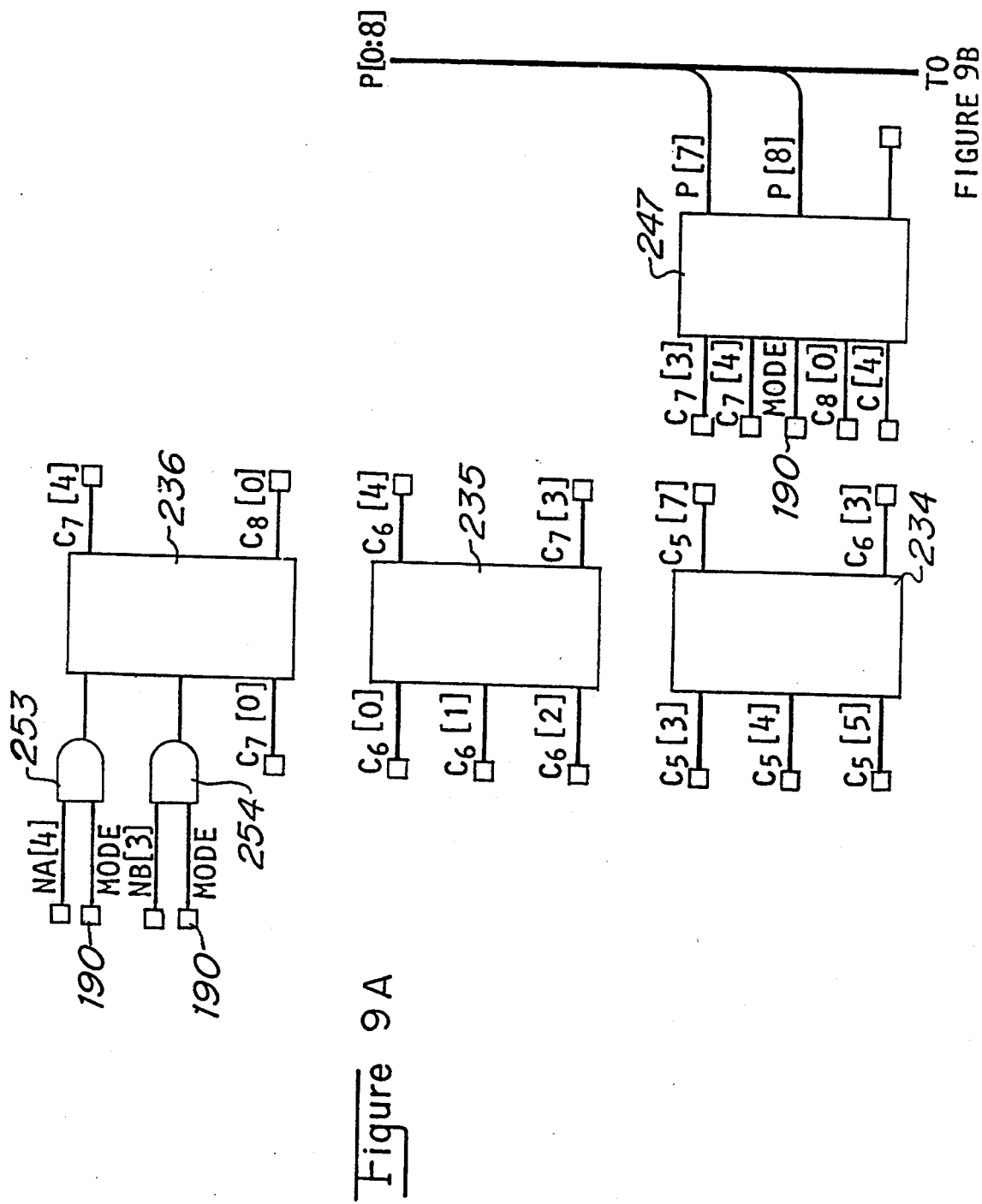

FIG. 8 (FIGS. 8A–8B) and FIG. 9 (FIGS. 9A–9B) show a schematic of a high-speed, multi-format multiplier generated by the multiplier compiler described by FIG. 7 in accordance with the preferred embodiment of the present invention.

Figure 10:
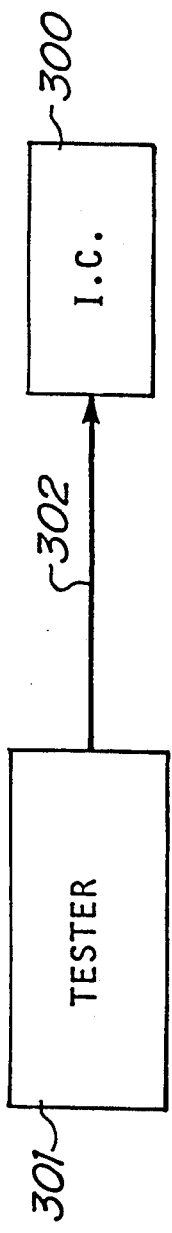

FIG. 10 shows a block diagram of a tester system in which a tester forwards test vectors to an integrated circuit which includes a multiplier in accordance with a preferred embodiment of the present invention.

DESCRIPTION OF THE PREFERRED EMBODIMENT

In the preferred embodiment of the present invention, a Wallace tree is modified in order to accommodate the direct multiplication of two's complement numbers. For a general description of a Wallace tree multiplier, see C. S. Wallace, "A Suggestion for Parallel Multipliers", IEEE Transactions on Electronic Computer, Vol. EC-13, February 1964, pp.14–17.

Figure 1A:
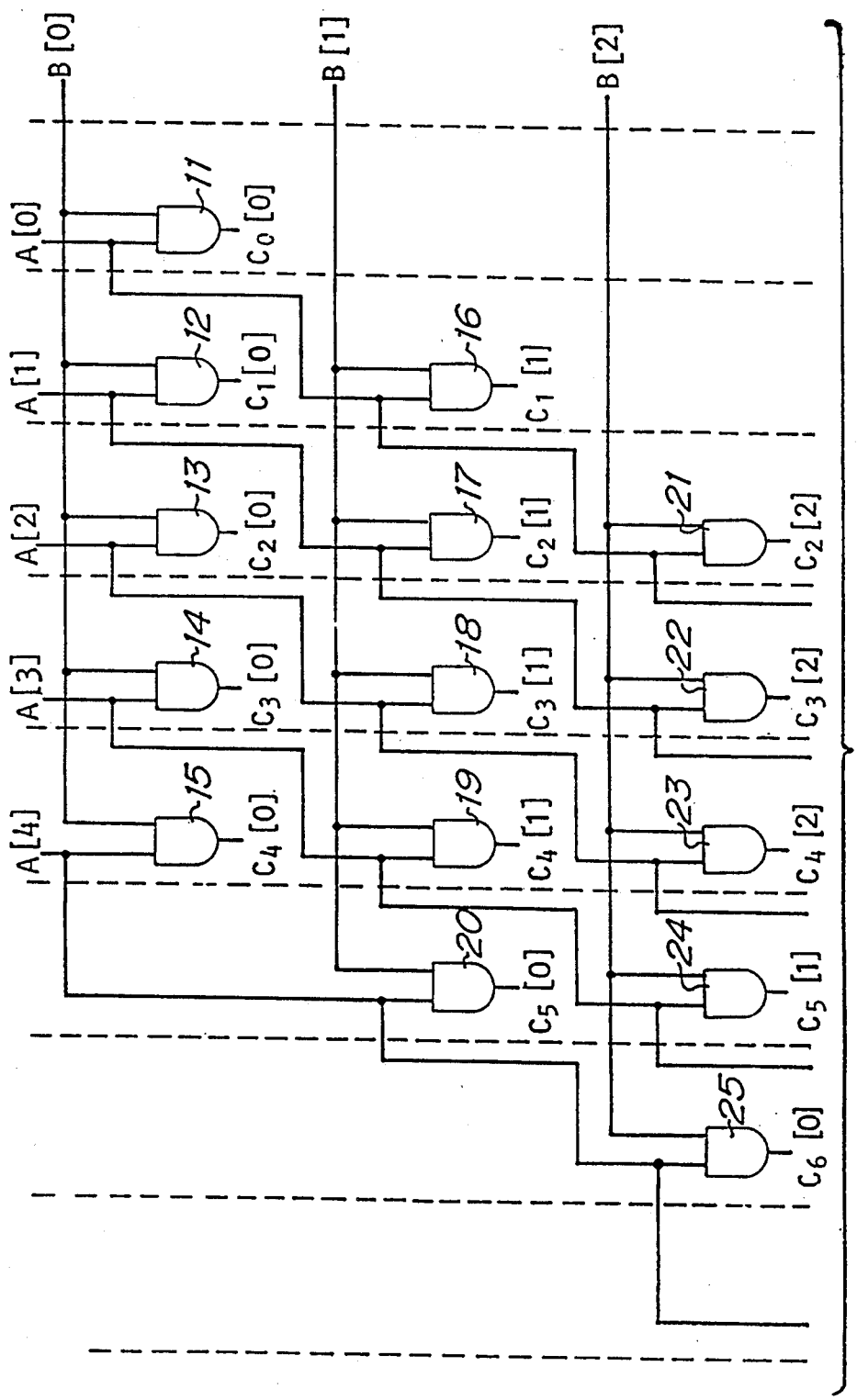
FIG. 1 (FIGS. 1A–1B) shows a prior art design of logical AND gates arranged to generate partial products used in a circuit which performs multiplication of unsigned magnitude numbers.
Figure 1B:
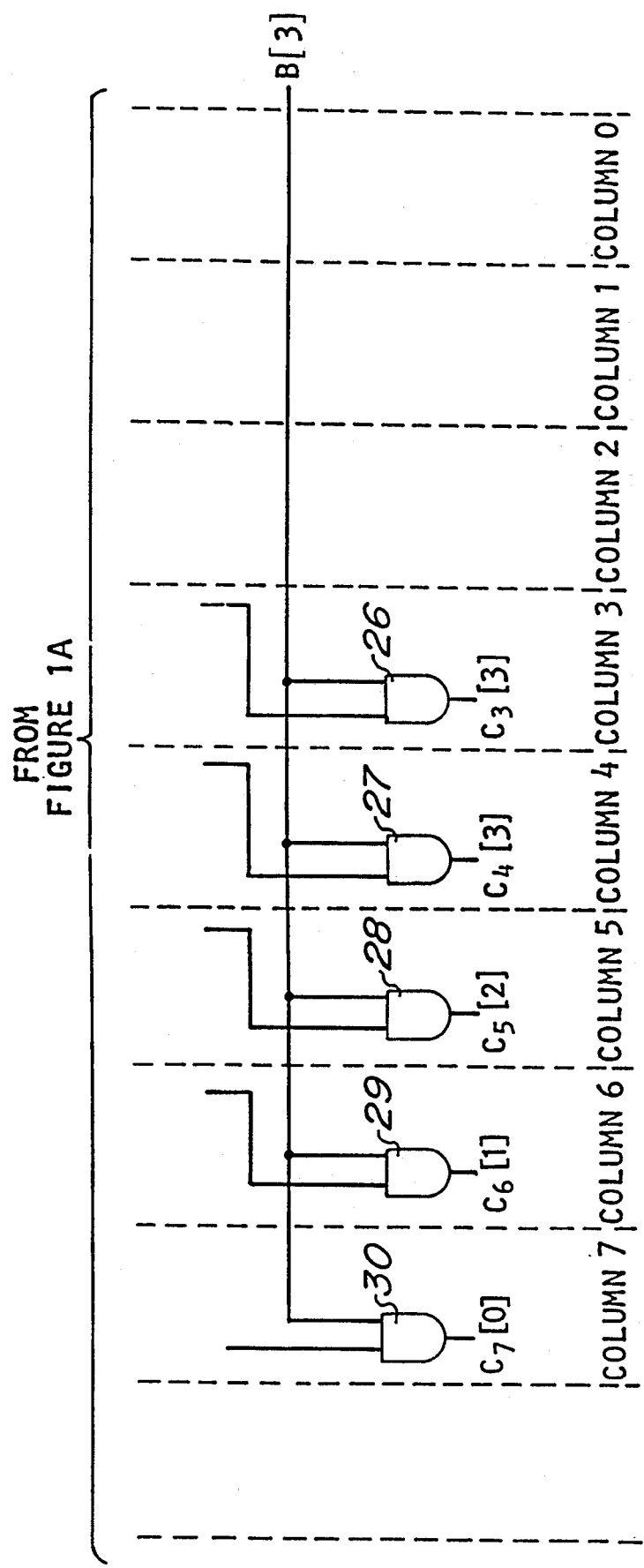

In the first stage of a prior art multiplier, an array of logic gates will produce several rows of partial products. For example, in a five by four multiplier, a five-bit multiplicand A has bits A[4], A[3], A[2], A[1], A[0] where bit A[4] is the high order bit and where bit A[0] is the low order bit, and a four-bit multiplier has bits B[3], B[2], B[1], B[0] where bit B[3] is the high order bit and where bit B[0] is the low order bit. In a typical prior art multiplier, an array of logical AND gates 11 through 30, shown in FIG. 1, are used to logically AND each bit of multiplicand A with each bit of multiplier B in order to generate a plurality of partial products.

The partial products are organized in rows. For example, a first row of partial product bits includes partial product bits labelled $C_0[0]$, $C_1[0]$, $C_2[0]$, $C_3[0]$ and $C_4[0]$. A second row of partial product bits includes partial product bits labelled $C_1[1]$, $C_2[1]$, $C_3[1]$, $C_4[1]$ and $C_5[0]$. A third row of partial product bits includes partial product bits labelled $C_2[2]$, $C_3[2]$, $C_4[2]$, $C_5[1]$ and $C_6[0]$. A fourth row of partial product bits includes partial product bits labelled $C_3[3]$, $C_4[3]$, $C_5[2]$, $C_6[1]$ and $C_7[0]$. Each of the partial product bits are also arranged into column 1 through column 7 as shown. In order to determine the value which each partial product bit represents, the partial product bit may be multiplied by two raised to the power represented by the column number. That is a partial product bit $C_5[0]$ which is in column five represents a value of $C_5[0]$ times $2^5$.

It has been shown that using an array similar to array of logical AND gates 11 through 26 allows the production of partial products useful in a multiplier which performs the multiplication of two's complement numbers. See, for example, Baugh, C. R. and Wooley, B. A., "A Two's Complement Parallel Array Multiplication Algorithm", IEEE Trans. Comp., Vol. C-22, No. 1-2, Dec. 1973, pp. 1045, 1047; or Kai Hwang, "Computer Arithmetic: Principles, Architecture and Design". New York: John Wiley & Sons, 1979, pp. 179-183.

As may be understood from these references, in general, for two's complement multiplication of a multiplicand A having n bits and a multiplier B having m bits, the partial products vary from standard partial products in the following ways. First, each bit of multiplier B, except the high order bit ($B_{m-1}$) is inverted before a logical AND is performed with the high order bit ($A_{n-1}$) of the multiplicand. Similarly, each bit of multiplicand A, except the high order bit ($A_{n-1}$) is inverted before a logical AND is performed with the high order bit ($B_{m-1}$) of the multiplier. Second, additional partial product bits are added as follows: A bit equal in value to high order bit $A_{n-1}$ is added to column n−1. A bit equal in value to high order bit $B_{m-1}$ is added to column m−1. A bit equal in value to the inverse of high order bit $A_{n-1}$ is added to column m+n−2. A bit equal in value to the inverse of high order bit $B_{m-1}$ is added to column m+n−2. A bit equal in value to 1 is added to column m+n−1.

For example, FIG. 2 shows how the logical AND gate array shown in FIG. 1 may be modified to accommodate the generation of partial product bits for two's complement multiplication. A logic "1" is used directly to generate a partial product bit $C_8[0]$.

An inverter 41 is used to invert multiplier bit B[0] before logic gate 15 performs a logic AND on multiplier bit B[O] and multiplicand bit A[4]. An inverter 42 is used to invert multiplier bit B[1] before logic gate 20 performs a logic AND on multiplier bit B[1] and multiplicand bit A[4]. An inverter 43 is used to invert multiplier bit B[2] before logic gate 25 performs a logic AND on multiplier bit B[2] and multiplicand bit A[4].

An inverter 44 is used to invert multiplicand bit A[0] before logic gate 26 performs a logic AND on multiplicand bit A[0] and multiplier bit B[3]. An inverter 45 is used to invert multiplicand bit A[1] before logic gate 27 performs a logic AND on multiplicand bit A[1] and multiplier bit B[3]. An inverter 46 is used to invert multiplicand bit A[2] before logic gate 28 performs a logic AND on multiplicand bit A[2] and multiplier bit B[3]. An inverter 47 is used to invert multiplicand bit A[3] before logic gate 29 performs a logic AND on multiplicand bit A[3] and multiplier bit B[3].

The multiplicand bit A[4] is used to directly generate a partial product bit $C_4[4]$. The multiplier bit B[3] is used to directly generate a partial product bit $C_3[4]$. An inverter 48 inverts multiplicand bit A[4] to generate a partial product bit $C_7[1]$. An inverter 49 inverts multiplier bit B[3] to generate a partial product bit $C_7[2]$.

Once the partial products are generated, a Wallace tree may be used to sum them. The present invention differs from the prior art, however, in that the additional partial product bits generated during the multiplication of two's complement numbers are included in the Wallace tree.

In a Wallace tree, each partial product is not dealt with as a whole, but rather each partial product bit, referred to as a summand, is handled individually. The Wallace tree employs rows of adders, each row of adders reducing the maximum number of summands in a column, until there is a maximum of two summands in each column. The reduction may be done in a variety of ways.

In the preferred embodiment of the present invention, full adders and half adders may be used to reduce the maximum number of summands in a column to a next lower predetermined stage. In the preferred embodiment of the present invention, the predetermined stages are 2, 3, 4, 6, 9, 13, 19, 28, 42, 63 . . . In general, a next higher stage $S_{j+1}$ may be calculated from an immediately lower stage $S_j$ by the formula:

$$S_{j+1} = S_j + int(S_j/2)$$

For example, in the example given in FIG. 2, there is one summand in column 0, there are two summands in column 1, there are three summands in column 2, there are five summands in column 3, there are five summands in column 4, there are three summands in column 5, there are two summands in column 6, there are three summands in column 7 and there is one summand in column 8. The maximum number of summands in a column is five summands in column 3 and in column 4. The next lower predetermined stage from five is four (recall the stages are 2, 3, 4, 6, 9, 13, 19, 28, 42, 63 . . . ). Therefore in every column in which the number of summands is greater than four, the first row of adders reduces the number of summands to four.

FIG. 3 shows a row of adders which performs the reduction. A half adder 111 receives summand $C_3[0]$ and summand $C_3[1]$ from column 3 and produces a summand $C_3[5]$ which is included in column 3 and a summand $C_4[5]$ which is included in column 4. Column 3 now has four summands while column 4 has six summands.

A full adder 112 receives summand $C_4[0]$, summand $C_4[1]$, and summand $C_4[2]$ from column 4 and produces a summand $C_4[6]$ which is included in column 4 and a summand $C_5[3]$ which is included in column 5. Column 4 now has four summands and column 5 has four summands. Since now the maximum summands per column is four, no further adders are required in this row.

After the first row of adders, shown in FIG. 3, there is one summand in column 0, there are two summands in column 1, there are three summands in column 2, there are four summands in column 3, there are four summands in column 4, there are four summands in column 5, there are two summands in column 6, there are three summands in column 7 and there is one summand in column 8. The maximum number of summands in a column is four summands in column 3, in column 4 and in column 5. The next lower predetermined stage from four is three. Therefore in every column in which the number of summands is greater than three, the second row of adders reduces the number of summands to three.

FIG. 4 shows a row of adders which performs the reduction. A half adder 121 receives summand $C_3[2]$ and summand $C_3[2]$ from column 3 and produces a summand $C_3[6]$ which is included in column 3 and a summand $C_4[7]$ which is included in column 4. Column 3 now has three summands while column 4 has five summands.

A full adder 122 receives summand $C_4[3]$, summand $C_4[4]$, and summand $C_4[5]$ from column 4 and produces a summand $C_4[8]$ which is included in column 4 and a summand $C_5[5]$ which is included in column 5. Column 4 now has three summands and column 5 has five summands.

A full adder 123 receives summand $C_5[0]$, summand $C_5[1]$, and summand $C_5[2]$ from column 5 and produces a summand $C_5[5]$ which is included in column 5 and a summand $C_6[2]$ which is included in column 6. Column 5 now has three summands and column 6 has three summands. Since now the maximum summands per column is three, no further adders are required in this row.

After the second row of adders, shown in FIG. 4, there is one summand in column 0, there are two summands in column 1, there are three summands in column 2, there are three summands in column 3, there are three summands in column 4, there are three summands in column 5, there are three summands in column 6, there are three summands in column 7 and there is one summand in column 8. The maximum number of summands in a column is three summands in column 2, in column 3, in column 4, in column 5, in column 6 and in column 7. The next lower predetermined stage from three is two. Therefore in every column in which the number of summands is greater than two, the third row of adders reduces the number of summands to two.

FIG. 5 shows a row of adders which performs the reduction. A half adder 131 receives summand $C_2[0]$ and summand $C_2[1]$ from column 2 and produces a summand $C_2[3]$ which is included in column 2 and a summand $C_3[7]$ which is included in column 3. Column 2 now has two summands while column 3 has four summands.

A full adder 132 receives summand $C_3[4]$, summand $C_3[5]$, and summand $C_3[6]$ from column 3 and produces a summand $C_3[8]$ which is included in column 3 and a summand $C_4[9]$ which is included in column 4. Column 3 now has two summands and column 4 has four summands.

A full adder 133 receives summand $C_4[6]$, summand $C_4[7]$, and summand $C_4[8]$ from column 4 and produces a summand $C_4[10]$ which is included in column 4 and a summand $C_5[6]$ which is included in column 5. Column 4 now has two summands and column 5 has four summands.

A full adder 134 receives summand $C_5[3]$, summand $C_5[4]$, and summand $C_5[5]$ from column 5 and produces a summand $C_5[7]$ which is included in column 5 and a summand $C_6[3]$ which is included in column 6. Column 5 now has two summands and column 6 has four summands.

A full adder 135 receives summand $C_6[0]$, summand $C_6[1]$, and summand $C_6[2]$ from column 6 and produces a summand $C_6[4]$ which is included in column 6 and a summand $C_7[3]$ which is included in column 7. Column 6 now has two summands and column 7 has four summands.

A full adder 136 receives summand $C_7[0]$, summand $C_7[1]$, and summand $C_7[2]$ from column 7 and produces a summand $C_7[4]$ which is included in column 7 and a summand $C_8[1]$ which is included in column 8. Column 7 now has two summands and column 8 has two summands.

After the third set of adders, shown in FIG. 5, there is one summand in column 0, and there are two summands in column 1 through column 8. An adder is used to sum the summands.

For example, FIG. 6 shows a ripple carry adder which may be used to perform the addition. A product bit $P_0$ is generated by summand $C_0[0]$. A half adder 141 receives summand $C_1[0]$ and $C_1[1]$. Half adder 141 produces a product bit $P_1$ and a carry out. A full adder 142 receives summand $C_2[2]$, summand $C_2[3]$ and the carry out from half adder 141. Full adder 142 produces a product bit $P_2$ and a carry out. A full adder 143 receives summand $C_3[7]$, summand $C_3[8]$ and the carry out from full adder 142. Full adder 143 produces a product bit $P_3$ and a carry out. A full adder 144 receives summand $C_4[9]$, summand $C_4[10]$ and the carry out from full adder 143. Full adder 144 produces a product bit $P_4$ and a carry out. A full adder 145 receives summand $C_5[6]$, summand $C_5[7]$ and the carry out from full adder 144. Full adder 145 produces a product bit $P_5$ and a carry out. A full adder 146 receives summand $C_6[3]$, summand $C_6[4]$ and the carry out from full adder 145. Full adder 146 produces a product bit $P_6$ and a carry out. A full adder 147 receives summand $C_7[3]$, summand $C_7[4]$ and the carry out from full adder 146. Full adder 147 produces a product bit $P_7$ and a carry out. A full adder 148 receives summand $C_8[0]$, summand $C_8[1]$ and the carry out from full adder 147. Full adder 148 produces a product bit $P_8$. The carry out from full adder 148 is not used.

In accordance with the preferred embodiment of the present invention, a circuit compiler may be used to generate the circuit described above for placement onto an integrated circuit. The output of the circuit compiler is a schematic rather than a "netlist" as is typical for prior art synthesizers and rather than a "hard layout" as is typical for prior art silicon compilers. The schematic output renders the logic of the multiplier more easily understandable to a designer and facilitates designer modifications. The schematic includes discrete components, for example, logic gates, half adders, full adders, etc. The discrete components are arranged in locations which show to the user the flow of logic of the circuit. This facilitates modification and thus customization of the multiplier. Wire segments extending from the discrete components are labelled. The labelling shows the connectivity between the discrete components. Alternately, for example, in less complex designs, wires may be shown between discrete components.

FIG. 7 shows a simplified block diagram of such a compiler program. In a step 72 the compiler program selects parameters for the multiplier. This selection may be based, for example, on parameters which were sent to the compiler program on start-up, or on information given by a user in response to prompting by the compiler program. These parameters may include, for example, a specification as to the format of the numbers to be multiplied, e.g., whether the multiplier will be multiplying unsigned magnitude numbers, two's complement numbers, or both. The parameters also may include the number of bits in the multiplier and the number of bits in the multiplicand.

In a step 73, the compiler program selects the type of adder which performs the final addition. This selection may be based, for example, on parameters which were sent to the compiler program on start-up, or on information given by a user in response to prompting by the compiler program. The user may directly indicate what type of adder to use. Alternately, the user may give the compiler other information, for instance the performance rate required for the multiplier. From this information, the compiler can determine the most suitable adder. In general, when conserving space on an integrated circuit is the most important consideration, a ripple carry adder will be used. When speed of the multipliers is of preeminent importance, adders such as carry-look ahead adders or carry save adders may be used.

In a step 74, the compiler program builds an array of AND gates which generate the summands discussed above. The array of AND gates is, for example, similar to the arrays shown in FIG. 2. Also, for some integrated circuits technologies, better performance is obtained by replacing some or all the AND gates with logical equivalents, for example NOR gates with inverted inputs.

In a step 75, the compiler program builds rows of adders which reduce the summands. Each adder within a row of adders, reduce the number of summands in a particular row. The rows of adders may include full adders which reduce three inputs to a sum bit and a carry bit. The rows of adders may also include half adders. Half adders receive two inputs and generate a sum bit and a carry bit. Alternately, other adder technologies may be utilized. For instance, a seven bit adder, e.g., a seven-to-three encoder, may be used in the reduction of the number of summands.

In a step 76, the compiler program builds a final adder based on the selection made in step 73. In a step 77, the compiler program displays a schematic of the multiplier. In a step 78, test vectors for the multiplier are generated.

FIG. 8 and FIG. 9 show an example of a schematic display generated by a compiler program according to the preferred embodiment of the present invention. In FIG. 8 and FIG. 9, when a mode input 190 is equal to zero, the multiplier implements the multiplication of a five bit multiplicand A by a four bit multiplicand B, both in unsigned magnitude format. When mode input 190 is equal to one, the multiplier implements the multiplication of five bit multiplicand A by four bit multiplicand B, both in two's complement format.

In FIG. 8, the array of AND gates in the generated multiplier is implemented using NOR gates. In order to invert the inputs to the NOR gates, a series of inverters 182 inverts multiplicand bits A[4], A[3], A[2], A[1], A[0] to produce inverted multiplicand bits NA[4], NA[3], NA[2], NA[1], NA[0]. Similarly, a series of inverters 183 inverts multiplier bits B[3], B[2], B[1], B[0] to produce inverted multiplier bits NB[3], NB[2], NB[1], NB[0].

Logical NOR gates 111–130 correspond to the Logical AND gates 11–30, shown in FIG. 1 and FIG. 2. Logical XNOR gates 191, 192, 193, 194, 195, 196 and 197 have been added to facilitate the multiplication of both two's complement numbers and unsigned magnitude numbers. Mode bit 190 is inverted by an inverter 181 before being connected to logical XNOR gates 191–197. When mode input 190 is one, logical NOR gate 115 receives multiplier bit B[0], logical NOR gate 120 receives multiplier bit B[1] and logical NOR gate 125 receives multiplier bit B[2]. Similarly, when mode input 190 is one, logical NOR gate 126 receives multiplicand bit A[0], logical NOR gate 127 receives multiplicand bit A[1], logical NOR gate 128 receives multiplicand bit A[2] and logical NOR gate 129 receives multiplicand bit A[3].

When mode input 190 is zero, logical NOR gate 115 receives the inverse of multiplier bit B[0], logical NOR gate 120 receives the inverse of multiplier bit B[1] and logical NOR gate 125 receives the inverse of multiplier bit B[2]. Similarly, when mode input 190 is zero, logical NOR gate 126 receives the inverse of multiplicand bit A[0], logical NOR gate 127 receives the inverse of multiplicand bit A[1], logical NOR gate 128 receives the inverse of multiplicand bit A[2] and logical NOR gate 129 receives the inverse of multiplicand bit A[3].

In FIG. 9, a full adder 211, with an input 260 connected to a ground (VSS) 260, corresponds to half adder 111 shown in FIG. 3. A logical AND gate 251 forwards the extra summand bit B[3] to full adder 211 when mode input bit 190 is equal to one. A full adder 212 corresponds to full adder 112. A logical AND gate 252 forwards the extra summand bit A[4] to full adder 211 when mode input bit 190 is equal to one.

A full adder 221, a full adder 222 and a full adder 223 correspond respectively to full adder 121, full adder 122 and full adder 123 shown in FIG. 4. A full adder 231, a full adder 232, a full adder 233, a full adder 234, a full adder 235 and a full adder 236 correspond respectively to full adder 131, full adder 132, full adder 133, full adder 34, full adder 135 and full adder 136 shown in FIG. 5. A logical AND gate 253 forwards the extra summand bit NA[4] to full adder 236 when mode input bit 190 is equal to one. A logical AND gate 254 forwards the extra summand bit NB[3] to full adder 236 when mode input bit 190 is equal to one.

The final addition of columns is implemented by a two-bit adder 241, a two-bit adder 243, a two-bit adder 245 and a two-bit adder 247. When it is essential to increase the speed of the multiplier, in step 73 the multiplier compiler selects two-bit adders 241, 243, 245 and 247 to be carry look-ahead adders or carry save adders. Otherwise, the multiplier compiler may select two-bit adders 241, 243, 245 and 247 to be ripple carry adders. Alternately, the multiplier compiler may select other adder configurations such as eight-bit or sixteen-bit adders.

In order to allow thorough testing of a multiplier in an integrated circuit with a minimum of non-zero test vectors, the multiplier compiler generates a set of non-zero test vectors. For each test vector, a value for the multiplicand and a value for the multiplier is given. These are entered into the multiplier and the answer is checked. In addition to the non-zero test vectors, at least one test vector should be included where the multiplier and the multiplicand are both equal to zero.

The following non-zero test vectors are generated as described in table 1 below:

TABLE 1

| | |
|---|---|
| Test Vector 1: | |
| Multiplicand: | all bits are 1. |
| Multiplier: | low order bit is 1, remaining bits are 0. |
| Test Vector 2: | |
| Multiplicand: | bits alternate between 0 and 1, low order bit is 0. |
| Multiplier: | bits alternate between 1 and 0, low order bit is 1. |
| Test Vector 3: | |
| Multiplicand: | all bits are 1. |
| Multiplier: | all bits are 1. |
| Test Vector 4: | |
| Multiplicand: | bits alternate between 0 and 1, low order bit is 0. |
| Multiplier: | bits alternate between 0 and 1, low order bit is 0. |
| Test Vector 5: | |
| Multiplicand: | bits alternate between 1 and 0, low order bit is 1. |
| Multiplier: | bits alternate between 1 and 0, low order bit is 1. |
| Remaining Test Vectors: | |
| Generating "walking ones" test vectors. For each bit position of the multiplicand and the multiplier a test vector is generated so that corresponding bits of the multiplicand and multiplier are 1 and the remaining bits are 0. By corresponding bits is meant bits in the same bit position. When there is not a bit in the multiplier (or the multiplicand) which is in the same bit position as a bit in the multiplicand (or the multiplier) because the multiplicand (or multiplier) is larger than the multiplier (or multiplicand), what is meant by a corresponding bit of such a bit in the multiplicand (or multiplier) is the high order bit in the multiplier (or multiplicand). | |

In order to toggle all bits within the multiplier, the value of the multiplier and the value of the multiplicand must be set to zero between one or more of the test vectors. For example, in Table 2 below, there is shown sample hexadecimal values for test vectors, both non-zero test vectors and test vectors of all zeros, for a ten by eight multiplier.

TABLE 2

| Multiplicand | Multiplier |
|---|---|
| 000 | 00 |
| 3ff | 01 |
| 000 | 00 |
| 2aa | 55 |
| 000 | 00 |
| 3ff | ff |
| 000 | 00 |
| 2aa | aa |
| 000 | 00 |
| 155 | 55 |
| 000 | 00 |
| 001 | 01 |
| 002 | 02 |
| 004 | 04 |
| 008 | 08 |
| 010 | 10 |
| 020 | 20 |
| 040 | 40 |
| 080 | 80 |
| 100 | 80 |

TABLE 2-continued

| Multiplicand | Multiplier |
|---|---|
| 200 | 80 |

FIG. 10 shows a tester 301 which forwards test vectors to an integrated circuit 300 through a tester interface 302. Integrated circuit 300 includes a multiplier which performs multiplication of the test vectors. An product of the multiplication is returned to the tester through tester interface 302. Tester 301 checks the product to assure the multiplication was performed without error.

A program implementing a compiler in accordance to the preferred embodiment is attached hereto as Appendix A.

APPENDIX A

```
#include <stdio.h>
#include <string.h>
#include <ctype.h>
#include "general.h"
#include "la_lib.h"
#include "mults.h"

#define FULL_DEBUG FALSE
#define DEBUG TRUE

/*******************************************************************
 * This routine creates a schematic for a wallace tree summand reduction multiplier.  *
 * The data format can be signed or unsigned magnitude or two's complement.           *
 * The output is <netlist_name>.la                                                    *
 *                                                       mark bapst                   *
 *******************************************************************/ main(argc, argv)
    int argc;
    char *argv[];
{
    char ckt_name[MAXNAME], tmpbuf[MAXNAME];
    int asize, bsize;
    int tmp, type;

/*******************************************************************
 * This section processes command line arguments.                   *
 *******************************************************************/ if (argc < 2)
    {
        fprintf(stderr, "\nUsage: wm8 <# a_bits> [<# b_bits>] [<ckt_name>]\n\n");
        exit(1);
    }

/*** asize >= bsize ***/
    asize = atoi(argv[1]);
    if (argc == 2)
        bsize = asize;
    else
    {
        tmp = atoi(argv[2]);
        if(tmp > asize)
        {
            bsize = asize;
            asize = tmp;
        }
        else
            bsize = tmp;
    }
    if(asize < 2 || bsize < 2)
    {
```

```
            fprintf(stderr, "Cannot generate summand reduction for less than 2 bits.\n\n");
            exit (1);
        } fprintf(stderr, "What type of %d x %d multiplier would you like to compile?\n\n", asize, bsize);
        while (TRUE)
        {
            fprintf(stderr, "Enter 0 for Unsigned Magnitude <default>\n");
            fprintf(stderr, "Enter 1 for Signed Magnitude    \n");
            fprintf(stderr, "Enter 2 for Two's Complement    \n");
            gets(tmpbuf);
            switch (tmpbuf[0])
            {
                case '0':
                case '\0':
                    type = 0;
                    break;
                case '1':
                    type = 1;
                    break;
                case '2':
                    type = 2;
                    break;
                default:
                    fprintf(stderr, "\"%s\" is not a supported type.\n\n", tmpbuf);
                    continue;
                    break;
            }
            break;
        }

/********************************************************
 * This section opens the output schematic file.        *
 ********************************************************/ if (argc > 3)
            strcpy(ckt_name, argv[3]);
        else if (type IS 0)
            sprintf(ckt_name, "wm%dx%d", asize, bsize);
        else if (type IS 1)
            sprintf(ckt_name, "wm%dx%dsm", asize, bsize);
        else if (type IS 2)
            sprintf(ckt_name, "wm%dx%dtc", asize, bsize);

make_wallace(ckt_name, asize, bsize, type);
} make_wallace(ckt_name, asize, bsize, type)
    int asize, bsize, type;
    char ckt_name[MAXNAME];
{
    char tmpbuf[MAXNAME];
    int msize, nsize, width;
    int i, j, k, m;
```

```
    int tmp, index, count, column, level;
    int num_devices, num_inst, num_nodenames, num_conns, num_gates;
    int max_inst;
    int step, next_reduction, num_summands;
    char name_ci[MAXNAME], name_a[MAXNAME], name_b[MAXNAME];
    char name_al[MAXNAME], name_bl[MAXNAME], name_co[MAXNAME];
    InstanceType   *instlist = NULL;
    NameType       *devicelist = NULL;
    SummandType    *summandlist = NULL, alist, blist, plist;
    ConnectorType  *connlist = NULL;
    ReturnType     returnlist;
    FILE *lafile;

num_inst = 0;
    num_nodenames = 0;
    num_gates = 0;

lafile = open_file(ckt_name, "la", "w");
    if (lafile IS NULL)
    {
        fprintf(stderr, "Cannot open output file \"%s.la\" ... Aborting.\n\n", ckt_name);
        exit (1);
    } switch (type)
    {
    case 0:
        msize = asize;
        nsize = bsize;
        break;
    case 1:
        msize = asize-1;
        nsize = bsize-1;
        break;
    case 2:
        msize = asize;
        nsize = bsize;
        break;
    default:
        fprintf(stderr, "\"%d\" is not a supported type.\n\n", type);
        break;
    } if (type IS 0)
        fprintf(stderr, "Compiling %d x %d unsigned magnitude multiplier...\n", asize, bsize);
    else if (type IS 1)
        fprintf(stderr, "Compiling %d x %d signed magnitude multiplier...\n", asize, bsize);
    else if (type IS 2)
        fprintf(stderr, "Compiling %d x %d two's complement multiplier...\n", asize, bsize);

/*********************************************
    * This section creates the device list.      *
    *********************************************/
```

```
num_devices = 3;
zalloc(devicelist, 10, NameType);

strcpy(devicelist[0].name, stdcell[INV3].name);
strcpy(devicelist[1].name, stdcell[NOR2].name);
strcpy(devicelist[2].name, stdcell[ADD2].name);

/*************************************************
 * This section creates the connector list.      *
 *************************************************/ fprintf(stderr, "1...");

/* This is the width of the product. */
if (type IS 1)
    width = msize + nsize + 1;
else
    width = msize + nsize;

/*** Assign connectors to connector and node lists ***/
num_conns = 3;
zalloc(connlist, num_conns, ConnectorType);

/*** A connector ***/
sprintf(connlist[0].name, "A[%d:0]", asize-1);
connlist[0].type = 1;
num_nodenames += asize;

/*** B connector ***/
sprintf(connlist[1].name, "B[%d:0]", bsize-1);
connlist[1].type = 1;
num_nodenames += bsize;

/*** P connector ***/
sprintf(connlist[2].name, "P[%d:0]", width-1);
connlist[2].type = 0;
num_nodenames += width;

/*************************************************
 * Compile the summand reduction stuff.          *
 *************************************************/ fprintf(stderr, "2...");

/*****************************
 * Build the AND plane *
 *****************************/

/*** Invert the input busses. ***/
returnlist.num_macros = NULL;
returnlist.max_columns = 2+nsize;
returnlist.num_columns = 2+nsize;
zalloc(returnlist.num_macros, returnlist.max_columns, int);
```

```
/*** Set returnlist for A inverters ***/
returnlist.num_macros[0] = msize;

/*** Set returnlist for B inverters ***/
returnlist.num_macros[1] = nsize;

/*** Set returnlist for NOR gates ***/
for(i=0; i<nsize; i++)
    returnlist.num_macros[2+i] = msize;

max_inst = (msize+nsize) + msize*nsize;
allocate_instlist(&instlist, &num_inst, &max_inst);

/*** A inverters ***/
for(i=0; i<msize; i++)
{
    strcpy(instlist[num_inst].name, stdcell[INV3].name);

/*** Instance name ***/
    sprintf(instlist[num_inst].inst_name, "AINV%d", i);
    instlist[num_inst].index = INV3;

/*** inverter input ***/
    sprintf(instlist[num_inst].pin_names[0], "A[%d]", i);

/*** inverter output ***/
    sprintf(instlist[num_inst].pin_names[1], "NA[%d]", i);

/*** Add output nodename to nodename list ***/
    num_nodenames++;
    num_inst++;
    num_gates += stdcell[INV3].num_gates;
}
/*** B inverters ***/
for(i=0; i<nsize; i++)
{
    strcpy(instlist[num_inst].name, stdcell[INV3].name);

/*** Instance name ***/
    sprintf(instlist[num_inst].inst_name, "BINV%d", i);
    instlist[num_inst].index = INV3;

/*** inverter input ***/
    sprintf(instlist[num_inst].pin_names[0], "B[%d]", i);

/*** inverter output ***/
    sprintf(instlist[num_inst].pin_names[1], "NB[%d]", i);

/*** Add nodename to nodename list ***/
    num_nodenames++;
    num_inst++;
    num_gates += stdcell[INV3].num_gates;
}
```

```
/*** Allocate the summand list. ***/
zalloc(summandlist, asize+bsize, SummandType);
for(i=0;i<width;i++)
{
    summandlist[i].node_name = NULL;
    summandlist[i].head = 0;
    summandlist[i].tail = 0;
    summandlist[i].max_nodes = MEM_ALLOC_INCR;
    zalloc(summandlist[i].node_name, summandlist[i].max_nodes, NameType);
}

/*** Add two's complement summands. ***/
/*** These are the summands for the Baugh-Wooley algorithm. ***/
if(type IS 2)
{
    sprintf(tmpbuf, "A[%d]", asize-1);
    add_summand(&summandlist[asize-1], tmpbuf);
    sprintf(tmpbuf, "B[%d]", bsize-1);
    add_summand(&summandlist[bsize-1], tmpbuf);

add_summand(&summandlist[asize+bsize-2], instlist[asize-1].pin_names[1]);
    add_summand(&summandlist[asize+bsize-2], instlist[asize+bsize-1].pin_names[1]);
}

/*** Add the NOR gates ***/
for(i=0; i<nsize; i++)
{
    for(j=0; j<msize; j++)
    {
        strcpy(instlist[num_inst].name, stdcell[NOR2].name);
        sprintf(instlist[num_inst].inst_name, "NORA%dB%d", j, i);
        instlist[num_inst].index = NOR2;
        /*** NOR inputs ***/
        if((i < nsize-1 && j < msize-1) || (i IS bsize-1 && j IS asize-1) || type ISN_T 2)
        {
            /* A && B */
            strcpy(instlist[num_inst].pin_names[0], instlist[j].pin_names[1]);
            strcpy(instlist[num_inst].pin_names[1], instlist[msize+i].pin_names[1]);
        }
        else if (i IS nsize-1 && j < msize-1)
        {
            /* Abar && B */
            sprintf(instlist[num_inst].pin_names[0], "A[%d]", j);
            strcpy(instlist[num_inst].pin_names[1], instlist[msize+i].pin_names[1]);
        }
        else if (j IS msize-1 && i < nsize-1)
        {
            /* A && Bbar */
            sprintf(instlist[num_inst].pin_names[1], "B[%d]", i);
```

```c
        strcpy(instlist[num_inst].pin_names[0], instlist[j].pin_names[1]);
    else
        fprintf(stderr, "Error occurred while building AND plane.\n");

/*** NOR output ***/
    if(i IS 0 && j IS 0)                /*** P[0] node ***/
    {
        strcpy(instlist[num_inst].pin_names[2], "P[0]");
    }
    else
    {
        /*** Add nodename to nodename list ***/
        if(i >= (msize-1-j))
            sprintf(instlist[num_inst].pin_names[2], "C&d[%d]", i+j, msize-1-j);
        else
            sprintf(instlist[num_inst].pin_names[2], "C&d[%d]", i+j, 1);

/*** Add column node to summand list. ***/
        add_summand(&summandlist[i+j], instlist[num_inst].pin_names[2]);
        num_nodenames++;
    }
    num_inst++;
    num_gates += stdcell[NOR2].num_gates;
}
/*******************************************************************************/
if (FULL_DEBUG)
{
    for(i=width-1; i>=0; i--)
    {
        printf("summandlist[%d].head = %d\n", i, summandlist[i].head);
        printf("summandlist[%d].tail = %d\n", i, summandlist[i].tail);
    }
    for(i=0; i<num_inst; i++)
    {
        printf("(%d)%s %s ", i, instlist[i].name, instlist[i].inst_name);
        printf("\n");
    }
}
fprintf(stderr, "3...");
/*******************************************************
 * Add the 1-bit adders for summand reduction *
 *******************************************************/
for(i=2; i < nsize; i += step)
    step = i / 2;
    next_reduction = i - step;
```

```c
for(i=0; i<width; i++)
{
    if ((summandlist[i].head - summandlist[i].tail) > (next_reduction + step))
    {
        next_reduction += step;
        break;
    }
}

/*** Perform summand reduction on each                       ***/
/*** column until only two summands are left.                ***/
if(returnlist.num_columns >= returnlist.max_columns)
{
    returnlist.max_columns += MEM_ALLOC_INCR;
    zalloc(returnlist.num_macros, returnlist.max_columns, int);
    for(k=returnlist.num_columns; k<returnlist.max_columns; k++)
        returnlist.num_macros[k] = 0;
}
returnlist.num_columns++;

level = 1;
while(next_reduction >= 2)
{
    count=0;

/*** Step thru each column ***/
    for(i=0; i<width; i++)
    {
        num_summands = summandlist[i].head - summandlist[i].tail;

if(FULL_DEBUG)
            fprintf(stderr, "num_summands[%d]/next_reduction = %d/%d\n",
                i, num_summands, next_reduction);
        /*** Remove nodes from columns with too many. ***/
        if(num_summands > next_reduction)
        {
            /*** Place half adders (ground A node) if necessary. ***/
            if((num_summands - next_reduction) % 2)
            {
                count++;
                allocate_instlist(&instlist, &num_inst, &max_inst);

strcpy(instlist[num_inst].name, stdcell[ADD1].name);
                sprintf(instlist[num_inst].inst_name, "ADD%d%d", level, count);
                instlist[num_inst].index = ADD1;

/*** adder inputs ***/
                strcpy(name_a, "VSS");
                remove_summand(&summandlist[i], name_b);
                remove_summand(&summandlist[i], name_ci);

strcpy(instlist[num_inst].pin_names[0], name_ci);
                strcpy(instlist[num_inst].pin_names[1], name_b);
                strcpy(instlist[num_inst].pin_names[2], name_a);
```

```
/*** Add "S" nodename to nodename list ***/
sprintf(tmpbuf, "C%d[%d]", i, summandlist[i].head);
add_summand(&summandlist[i], tmpbuf);
strcpy(instlist[num_inst].pin_names[4], tmpbuf);

/*** Add "CO" nodename to nodename list ***/
sprintf(tmpbuf, "C%d[%d]", i+1, summandlist[i+1].head);
add_summand(&summandlist[i+1], tmpbuf);
strcpy(instlist[num_inst].pin_names[3], tmpbuf);

num_nodenames += 2;
num_inst++;
num_gates += stdcell[ADD1].num_gates;

if(returnlist.num_macros[returnlist.num_columns-1] & (msize+1) IS 0 &&
   returnlist.num_macros[returnlist.num_columns-1] ISN_T 0)
{
   /*** Column is getting too high, so we need a new one. ***/
   if(returnlist.num_columns >= returnlist.max_columns)
   {
      returnlist.max_columns += MEM_ALLOC_INCR;
      zalloc(returnlist.num_macros, returnlist.max_columns, int);
      for(k=returnlist.num_columns; k<returnlist.max_columns; k++)
         returnlist.num_macros[k] = 0;
   }
   returnlist.num_columns++;
}
(returnlist.num_macros[returnlist.num_columns-1])++;
}
/*** Place as many full adders as needed. ***/
for(j=0; j<(num_summands-next_reduction)/2; j++)
{
   count++;
   allocate_instlist(&instlist, &num_inst, &max_inst);

strcpy(instlist[num_inst].name, stdcell[ADD1].name);
   sprintf(instlist[num_inst].inst_name, "ADD%d%d", level, count);
   instlist[num_inst].index = ADD1;

/*** adder inputs ***/
   remove_summand(&summandlist[i], name_a);
   remove_summand(&summandlist[i], name_b);
   remove_summand(&summandlist[i], name_ci);

strcpy(instlist[num_inst].pin_names[0], name_ci);
   strcpy(instlist[num_inst].pin_names[1], name_b);
   strcpy(instlist[num_inst].pin_names[2], name_a);

/*** Add "S" nodename to nodename list ***/
   sprintf(tmpbuf, "C%d[%d]", i, summandlist[i].head);
   add_summand(&summandlist[i], tmpbuf);
   strcpy(instlist[num_inst].pin_names[4], tmpbuf);
```

```
                /*** Add "CO" nodename to nodename list ***/
                sprintf(tmpbuf, "C%d[%d]", i+1, summandlist[i+1].head);
                add_summand(&summandlist[i+1], tmpbuf);
                strcpy(instlist[num_inst].pin_names[3], tmpbuf);

num_nodenames += 2;
                num_inst++;
                num_gates += stdcell[ADD1].num_gates;

if(returnlist.num_macros[returnlist.num_columns-1] & (msize+1) IS 0 &&
                   returnlist.num_macros[returnlist.num_columns-1] ISN_T 0)
                {
                    /*******************************************************
                     * Column is getting too high, so we need a new one.    *
                     * (but make sure there are more than two adders left,  *
                     * because this will make sure that you won't make a    *
                     * new column for one or two macros.                    *
                     *******************************************************/
                    if(returnlist.num_columns >= returnlist.max_columns)
                    {
                        returnlist.max_columns += MEM_ALLOC_INCR;
                        zalloc(returnlist.num_macros, returnlist.max_columns, int);
                        for(k=returnlist.num_columns; k<returnlist.max_columns; k++)
                            returnlist.num_macros[k] = 0;
                    }
                    returnlist.num_columns++;
                }
                (returnlist.num_macros[returnlist.num_columns-1])++;
            }
        }
        if(returnlist.num_columns >= returnlist.max_columns)
        {
            returnlist.max_columns += MEM_ALLOC_INCR;
            zalloc(returnlist.num_macros, returnlist.max_columns, int);
            for(k=returnlist.num_columns; k<returnlist.max_columns; k++)
                returnlist.num_macros[k] = 0;
        }
        returnlist.num_columns++;

for(i=2; i < next_reduction; i += step)
            step = i / 2;
        next_reduction = i - step;
        level++;
    } if(type IS 1)
        tmp = width - 2;
    else
        tmp = width - 1;

for(j=1; j<tmp; j++)
    {
        /*** Alias the last two summands to P1 & P2 type names ***/
```

```c
for(i=0; i<num_inst; i++)
{
    for(k=0; k<stdcell[instlist[i].index ].num_pins; k++)
    {
        if(strcmp(summandlist[j].node_name[(summandlist[j].head)-1].name,
                  instlist[i].pin_names[k]) IS 0)
            sprintf(instlist[i].alias[k], "P2[%d]", j);
        else if(strcmp(summandlist[j].node_name[(summandlist[j].head)-2].name,
                       instlist[i].pin_names[k]) IS 0)
            sprintf(instlist[i].alias[k], "P1[%d]", j);
    }
}

/* Allocate the adder lists. */ for(i=0;i<width;i++)
{
    alist.node_name = NULL;
    alist.head = 0;
    alist.tail = 0;
    alist.max_nodes = width;
    zalloc(alist.node_name, alist.max_nodes, NameType);

blist.node_name = NULL;
    blist.head = 0;
    blist.tail = 0;
    blist.max_nodes = width;
    zalloc(blist.node_name, blist.max_nodes, NameType);

plist.node_name = NULL;
    plist.head = 0;
    plist.tail = 0;
    plist.max_nodes = width;
    zalloc(plist.node_name, plist.max_nodes, NameType);
}
fprintf(stderr, "4...");

/*************************************
 * Designate the adder inputs. *
 *************************************/ strcpy(name_ci, "VSS");

if (type IS 0)
{
    for(i=1; i<width-1; i++)
    {
        remove_summand(&summandlist[i], name_a);
        remove_summand(&summandlist[i], name_b);
        add_summand(&alist, name_a);
        add_summand(&blist, name_b);
        sprintf(tmpbuf, "P[%d]", i);
        add_summand(&plist, tmpbuf);
```

```c
          }
          sprintf(tmpbuf, "P[%d]", width-1);
          strcpy(name_co, tmpbuf);
        }
        if((width - 1) & 2 IS 1)
        {
          strcpy(devicelist[3].name, stdcell[ADD1].name);
          num_devices++;
        }
      }
      else if (type IS 1)
      {
        for(i=1; i<width-2; i++)
        {
          remove_summand(&summandlist[i], name_a);
          add_summand(&alist, name_a);
          remove_summand(&summandlist[i], name_b);
          add_summand(&blist, name_b);
          sprintf(tmpbuf, "P[%d]", i);
          add_summand(&plist, tmpbuf);
        }
        sprintf(tmpbuf, "P[%d]", width-2);
        strcpy(name_co, tmpbuf);

allocate_instlist(&instlist, &num_inst, &max_inst);

/*** Add Exclusive-OR gates on sign bit. ***/
        strcpy(instlist[num_inst].name, stdcell[XOR].name);

/*** Instance name ***/
        strcpy(instlist[num_inst].inst_name, "XOR");
        instlist[num_inst].index = XOR;

(returnlist.num_macros[returnlist.num_columns-1])++;

/*** XOR inputs ***/
        sprintf(tmpbuf, "A[%d]", asize-1);
        strcpy(instlist[num_inst].pin_names[0], tmpbuf);

sprintf(tmpbuf, "B[%d]", bsize-1);
        strcpy(instlist[num_inst].pin_names[1], tmpbuf);

/*** XOR output ***/
        sprintf(tmpbuf, "P[%d]", width-1);
        strcpy(instlist[num_inst].pin_names[2], tmpbuf);

num_inst++;
        num_gates += stdcell[XOR].num_gates;

if((width - 2) & 2 IS 1)
        {
          strcpy(devicelist[3].name, stdcell[ADD1].name);
          num_devices++;
        }
```

```c
        strcpy(devicelist[num_devices].name, stdcell[XOR].name);
        num_devices++;
    }
    else if (type IS 2)
    {
        for(i=1; i<width-1; i++)
        {
            remove_summand(&summandlist[i], name_a);
            add_summand(&alist, name_a);
            remove_summand(&summandlist[i], name_b);
            add_summand(&blist, name_b);
            sprintf(tmpbuf, "p[%d]", i);
            add_summand(&plist, tmpbuf);
        }
        /*** MSB adder ***/
        add_summand(&alist, "VDD");
        remove_summand(&summandlist[i], name_b);
        add_summand(&blist, name_b);
        sprintf(tmpbuf, "p[%d]", width-1);
        add_summand(&plist, tmpbuf);
    }
    strcpy(name_co, "unused");
    num_nodenames++;

if((width - 1) & 2 IS 1)
    {
        strcpy(devicelist[3].name, stdcell[ADD1].name);
        num_devices++;
    }
}
else
{
    fprintf(stderr, "Cannot generate output adder.\n");
    exit(1);
} bld_ripple_adder(&num_inst, &max_inst, &num_gates, name_ci, name_co,
                 &instlist, &alist, &blist, &plist, &returnlist);

if(FULL_DEBUG)
{
    for(i=0; i<returnlist.num_columns; i++)
        fprintf(stderr, "returnlist.num_macros[%d] = %d \n", i, returnlist.num_macros[i]);
}

/********************************************************
 * This section prints the VLSI schematic file.         *
 ********************************************************/
fprintf(stderr, "5...");
bld_la_header(lafile, ckt_name, returnlist, devicelist, num_devices,
              connlist, num_conns, instlist, num_inst);

fprintf(stderr, "6...");
bld_la_inst(lafile, returnlist, instlist, num_inst);
```

```
        fprintf(stderr, "7...\n\n");
        bld_la_segment(lafile,returnlist,instlist,num_inst,num_conns);

fprintf(lafile, "E\n");

fprintf(stderr, "\"%s.la\" written\n\n", ckt_name);

fprintf(stderr, "Circuit contains %d instances, %d pins, and approximately %d gates.\n\n",
                num_inst, num_nodenames, num_gates);

fclose(lafile);

/*** Compile test vectors. ***/
        if(asize < 33 && bsize < 33)
        {
            printf("\nDo you want test vectors? <no>\n");
            while(TRUE)
            {
                gets(tmpbuf);
                switch (tmpbuf[0])
                {
                    case 'n':
                    case 'N':
                    case '\0':
                        break;
                    case 'y':
                    case 'Y':
                        print_test_vectors(asize, bsize, type, ckt_name);
                        break;
                    default:
                        printf("Please answer yes or no.\n\n");
                        continue;
                        break;
                }
                break;
            }
        }
    } typedef struct {
    NameType *node_name;
    int head;
    int tail;
    int num_nors;
    int max_nodes;
    } SummandType;

#include <stdio.h>
#include <string.h>
#include "general.h"
#include "la_lib.h"
#include "mults.h"

#define VSS 1
define VDD 2
```

```
#define NUM_VECTORS 11
typedef struct {
    int adata;
    int bdata;
    } VectorType;

/* These patterns, plus a walking one's pattern have been
 * found to provide a 99% fault coverage rate for the 2's
 * complement Wallace multiplier and a 98% coverage for
 * the signed and unsigned magnitude multipliers with a
 * ripple adder on their output */
static VectorType vlist[] = {
    0x00000000, 0x00000000,
    0xffffffff, 0x00000001,
    0x00000000, 0x00000000,
    0xaaaaaaaa, 0x55555555,
    0x00000000, 0x00000000,
    0xffffffff, 0xffffffff,
    0x00000000, 0x00000000,
    0xaaaaaaaa, 0xaaaaaaaa,
    0x00000000, 0x00000000,
    0x55555555, 0x55555555,
    0x00000000, 0x00000000
};

bld_ripple_adder(num_inst, max_inst, num_gates, ci_name, co_name,
                 instlist, alist, blist, plist, returnlist)
    int *num_inst, *max_inst, *num_gates;
    char ci_name[MAXNAME], co_name[MAXNAME];
    InstanceType **instlist;
    SummandType *alist, *blist, *plist;
    ReturnType *returnlist;
{
    int i, j, k, count;
    int num_nodenames = 0, max_nodenames = 0;
    char tmpbuf[MAXNAME];
    int node_ci, node_a, node_b, node_a1, node_b1;
    char name_ci[MAXNAME], name_a[MAXNAME], name_b[MAXNAME];
    char name_a1[MAXNAME], name_b1[MAXNAME];
    InstanceType *newinstlist;
    NameType *nodenamelist = NULL;

newinstlist = *instlist;

count=0;
    /*** Build a ripple adder until alist is exhausted. ***/
    for(i=alist->tail; i<alist->head; i+=2)
    {
        /*** Add 2-bit adders ***/
        if( i ISN_T (alist->head-1))
        {
            count++;
            if(*num_inst >= *max_inst)
```

```c
        *max_inst += MEM_ALLOC_INCR;
        zalloc(newinstlist, *max_inst, InstanceType);
    }
    for(j=*num_inst; j<*max_inst; j++)
    {
        for(k=0; k<MAXCONN; k++)
            newinstlist[j].alias[k][0] = '\0';
    }
} strcpy(newinstlist[*num_inst].name, stdcell[ADD2].name);
sprintf(tmpbuf, "PADD%d%d", i, i+1);
strcpy(newinstlist[*num_inst].instname, tmpbuf);
newinstlist[*num_inst].index = ADD2;
/*** adder inputs ***/
if (count is 1)
{
    strcpy(name_ci, ci_name);
}
else
{
    strcpy(name_ci, nodenamelist[num_nodenames-1].name);
}
remove_summand(blist, name_b);
remove_summand(alist, name_a);
remove_summand(blist, name_b1);
remove_summand(alist, name_a1);

strcpy(newinstlist[*num_inst].pin_names[0], name_ci);
strcpy(newinstlist[*num_inst].pin_names[1], name_b1);
strcpy(newinstlist[*num_inst].pin_names[2], name_a1);
strcpy(newinstlist[*num_inst].pin_names[3], name_b);
strcpy(newinstlist[*num_inst].pin_names[4], name_a);

/*** adder outputs ***/
if (i IS (alist->head-2))   /*** MSB adder ***/
{
    strcpy(newinstlist[*num_inst].pin_names[5], co_name);
}
else
{
    sprintf(tmpbuf, "CO[%d]", i);
    strcpy(newinstlist[*num_inst].pin_names[5], tmpbuf);

if(num_nodenames >= max_nodenames)
    {
        max_nodenames += MEM_ALLOC_INCR;
        zalloc(nodenamelist, max_nodenames, NameType);
    }
    strcpy(nodenamelist[num_nodenames].name, tmpbuf);
    (num_nodenames)++;
}
remove_summand(plist, newinstlist[*num_inst].pin_names[7]); /* S0 */
remove_summand(plist, newinstlist[*num_inst].pin_names[6]); /* S1 */
```

```
      (*num_inst)++;
      *num_gates += stdcell[ADD2].num_gates;
      (returnlist->num_macros[returnlist->num_columns-1])++;
   }
   else  /*** Odd adder goes on MSB ***/
   {
      count++;
      strcpy(name_ci, nodenamelist[num_nodenames-1].name);
      remove_summand(blist, name_b);
      remove_summand(alist, name_a);
      if(*num_inst >= *max_inst)
      {
         *max_inst += MEM_ALLOC_INCR;
         xalloc(newinstlist, *max_inst, InstanceType);
         for(j=*num_inst; j<*max_inst; j++)
         {
            for(k=0; k<MAXCONN; k++)
               newinstlist[j].alias[k][0] = '\0';
         }
      }
      strcpy(newinstlist[*num_inst].name, stdcell[ADD1].name);
      sprintf(tmpbuf, "PADD8d", i);
      strcpy(newinstlist[*num_inst].inst_name, tmpbuf);
      newinstlist[*num_inst].index = ADD1;
      /*** adder inputs ***/
      strcpy(newinstlist[*num_inst].pin_names[0], name_ci);
      strcpy(newinstlist[*num_inst].pin_names[1], name_b);
      strcpy(newinstlist[*num_inst].pin_names[2], name_a);

/*** adder outputs (MSB adder, CO=P[MSB]) ***/
      strcpy(newinstlist[*num_inst].pin_names[3], co_name);
      remove_summand(plist, newinstlist[*num_inst].pin_names[4]); /* S */

(*num_inst)++;
      *num_gates += stdcell[ADD1].num_gates;
      (returnlist->num_macros[returnlist->num_columns-1])++;
   }
   *instlist = newinstlist;
}

/*************************************************/
/* Procedure to add a node to the summand list. */
/*************************************************/
add_summand(slist, nodename)
   SummandType *slist;
   char nodename[MAXNAME];
{
   if(slist->head >= slist->max_nodes)
   {
      slist->max_nodes += MEM_ALLOC_INCR;
```

```c
        zalloc(slist->node_name, slist->max_nodes, NameType);
    }
    strcpy(slist->node_name[slist->head].name, nodename);
    slist->head++;
}

/***********************************************************/
/* Procedure to remove a node from the summand list. */
/***********************************************************/
remove_summand(slist, nodename)
    SummandType *slist;
    char *nodename;
{
    strcpy(nodename, slist->node_name[slist->tail]);
    slist->tail++;
}

/***********************************************************
 * Procedure to print test vectors for multipliers.        *
 * This procedure cannot handle multiplier or multiplicand *
 * bit widths greater than 32. For product bit widths      *
 * which are greater than 32, the answers are not displayed*
 ***********************************************************/
print_test_vectors(asize, bsize, TYPE, name)
    int asize, bsize, TYPE;
    char name[32];
{
    int imask, jmask, pmask;
    int isign, jsign, psign;
    int amask, bmask;
    int adata, bdata;
    int i, j;
    int TOOBIG;
    char tmpbuf[32], field[133];
    char xbuf[17];
    FILE *tblfile;

strcpy(xbuf, "xxxxxxxxxxxxxxxx");

/*** Open output file. ***/
    tblfile = open_file(name, "tbl", "w");
    if (tblfile IS_NULL)
    {
        fprintf(stderr, "ERROR: Cannot open output file %s\n", name);
        exit(1);
    }

/*** Print pinorder header. ***/
    if (TYPE IS 0 || TYPE IS 2)
    {
        fprintf(tblfile, "PinOrder 'ha[%d:0], 'hb[%d:0], 'hp[%d:0];\n",
```

```
                    asize-1, bsize-1, asize+bsize-1);
    }
    else if (TYPE IS 1)
    {
        fprintf(tblfile, "PinOrder 'ha[%d:0], 'hb[%d:0], 'hp[%d:0];\n",
                    asize-1, bsize-1, asize+bsize-2);
    }

TOOBIG = NO;
/*** Compile unsigned magnitude vectors ***/
if (TYPE IS 0)
{
    if((asize+bsize-1) > 31)
    {
        TOOBIG = YES;
        printf("Product is too big.  Expected results will not be given.\n");
    }
    if(TOOBIG)
    {
        strncpy(tmpbuf, xbuf, (asize+bsize+3)/4);
        sprintf(field, "%%0%dx %s;\n",
                    (asize+3)/4, (bsize+3)/4, tmpbuf);
    }
    else
        sprintf(field, "%%0%dx %%0%dx  %%0%dx;\n",
                    (asize+3)/4, (bsize+3)/4, (asize+bsize+3)/4);

pmask = power(2, (asize+bsize)) - 1;
    imask = power(2, asize) - 1;
    jmask = power(2, bsize) - 1;
    for (i=0; i<NUM_VECTORS; i++)
    {
        if(TOOBIG)
            fprintf(tblfile, field, vlist[i].adata & imask, vlist[i].bdata & jmask);
        else
            fprintf(tblfile, field, vlist[i].adata & imask, vlist[i].bdata & jmask,
                    ((vlist[i].adata & imask) * (vlist[i].bdata & jmask)) & pmask);
    }

/* Walking one's patterns */
    amask = 1;
    bmask = 1;
    for (i=0; i<asize; i++)
    {
        if(TOOBIG)
            fprintf(tblfile, field, amask & imask, bmask & jmask);
        else
            fprintf(tblfile, field, amask & imask, bmask & jmask,
                    ((amask & imask) * (bmask & jmask)) & pmask);
        amask = amask << 1;
        if(i < bsize-1)
            bmask = bmask << 1;
    }
}

/*** Compile signed magnitude vectors ***/
else if (TYPE IS 1)
```

```c
        if((asize+bsize-2) > 31)
        {
            TOOBIG = YES;
            printf("Product is too big.  Expected results will not be given.\n");
        }
        if(TOOBIG)
        {
            strncpy(tmpbuf, xbuf, (asize+bsize+3)/4);
            sprintf(field, "%%0%dx %s;\n",
                    (asize+3)/4, (bsize+3)/4, tmpbuf);
        }
        else
            sprintf(field, "%%0%dx %%0%dx %%0%dx;\n",
                    (asize+3)/4, (bsize+3)/4, (asize+bsize+3)/4);

pmask = power(2, (asize+bsize-1)) - 1;
        amask = power(2, asize-1) - 1;
        bmask = power(2, bsize-1) - 1;
        imask = power(2, asize) - 1;
        jmask = power(2, bsize) - 1;
        for (i=0; i<NUM_VECTORS; i++)
        {
            isign = (vlist[i].adata & imask) >> asize-1;
            jsign = (vlist[i].bdata & jmask) >> bsize-1;
            psign = (isign ^ jsign) << (asize+bsize-2);
            if (TOOBIG)
                fprintf(tblfile, field, vlist[i].adata & imask, vlist[i].bdata & jmask,
                        (((vlist[i].adata & amask) * (vlist[i].bdata & bmask)) | psign) & pmask);
            else
                fprintf(tblfile, field, adata, bdata);
        }
        /* Walking one's patterns */
        adata = 1;
        bdata = 1;
        for (i=0; i<asize; i++)
        {
            isign = (adata & imask) >> asize-1;
            jsign = (bdata & jmask) >> bsize-1;
            psign = (isign ^ jsign) << (asize+bsize-2);
            if (TOOBIG)
                fprintf(tblfile, field, adata, bdata);
            else
                fprintf(tblfile, field, adata, bdata,
                        (((adata & amask) * (bdata & bmask)) | psign) & pmask);
            adata = adata << 1;
            if(i < bsize-1)
                bdata = bdata << 1;
        }
    }
    /*** Compile two's complement vectors ***/
    else if (TYPE IS 2)
    {
        if((asize+bsize-1) > 31)
```

```c
    {
        TOOBIG = YES;
        printf("Product is too big.  Expected results will not be given.\n");
    }
    if(TOOBIG)
    {
        strncpy(tmpbuf, xbuf, (asize+bsize+3)/4);
        sprintf(field, "%%0%dx %s;\n",
            (asize+3)/4, (bsize+3)/4, tmpbuf);
    }
    else
        sprintf(field, "%%0%dx %%0%dx %%0%dx;\n",
            (asize+3)/4, (bsize+3)/4, (asize+bsize+3)/4);
    pmask = power(2, (asize+bsize)) - 1;
    imask = power(2, asize) - 1;
    jmask = power(2, bsize) - 1;
    for (i=0; i<NUM_VECTORS; i++)
    {
        amask = (vlist[i].adata << (32 - asize)) >> (32 - asize);
        bmask = (vlist[i].bdata << (32 - bsize)) >> (32 - bsize);
        if (TOOBIG)
            fprintf(tblfile, field, vlist[i].adata & imask, vlist[i].bdata & jmask);
        else
            fprintf(tblfile, field, vlist[i].adata & imask, vlist[i].bdata & jmask,
                (amask*bmask) & pmask);
    }
    /* Walking one's patterns */
    amask = 1;
    bmask = 1;
    for (i=0; i<asize; i++)
    {
        if (TOOBIG)
            fprintf(tblfile, field, amask & imask, bmask & jmask);
        else
            fprintf(tblfile, field, amask & imask, bmask & jmask,
                (amask*bmask) & pmask);
        amask = amask << 1;
        if(i < bsize-1)
            bmask = bmask << 1;
    }
    fclose(tblfile);
    fprintf(stderr, "\"%s.tbl\" written\n\n", name);
}

/****************************************/
/* Procedure for exponentiation.        */
/****************************************/ power(a, exponent)
    int a, exponent;
{
```

```
        int i, p;

p = 1;
        for(i=1; i<=exponent; i++)
            p = p*a;
        return(p);
} include <stdio.h>
include "general.h"
#include "la_lib.h"

#define DEFAULT         0
#define BLACK           1
#define RED             3
#define YELLOW          4
#define BLUE            5
#define GREEN           6
#define INST_COLOR    BLUE
define WIRE_COLOR   BLACK define STANDARD        0
define ROT90CC         1
#define ROT180          2
#define ROT90C          3
#define MX              4
#define MXROT90CC       5
#define MY              6
#define MYROT90CC       7
define ORIENT    STANDARD /***********************************************************
 *   $H This routine prints a file header for VLSI schematic *
 *      including the schematic's icon info.                 *
 ***********************************************************/
bld_la_header(lafile, ckt_name, returnlist, devicelist, num_devices,
                       connlist, num_conn, instlist, num_inst)
    char ckt_name[MAXNAME];
    int num_devices, num_conn, num_inst;
    InstanceType *instlist;
    ReturnType returnlist;
    NameType *devicelist;
    ConnectorType *connlist;
    FILE *lafile;
{
    int i, j, k;
    int icon_width, icon_height;
    int max_width, cell_width, max_height, height;
    int num_inputs, num_outputs;
    int count;
    int bottom_pins, top_pins, aliases;
    char datebuf[10], timebuf[6];

get_date(datebuf);
```

```
        get_time(timebuf);
        fprintf(lafile, "#cell2 * %s la * 34 any 17408 v8r1.4\n", ckt_name);
        fprintf(lafile, "# \"%s GMT\"\ \"%s GMT\"\ \"%s GMT\"\ \" bapst *",
                datebuf, timebuf, datebuf, timebuf);
        /***************************************
         * Print device modelling info. *
         ***************************************/
        for(i=0; i<num_devices; i++)
        {
            fprintf(lafile, " .la %s:portable", devicelist[i].name);
            if(i % 3 IS 0 && i ISN_T (num_devices-1))
                fprintf(lafile, "\n#");
        }
        fprintf(lafile, " .\n");

/***************************************************************
         * This section calculates the border dimensions needed. *
         ***************************************************************/
        count = 0;
        max_height = 0;
        max_width = 2*XMARGIN;
        for(i=0; i<returnlist.num_columns; i++)
        {
            height = 0;
            cell_width = 0;
            for(j=0; j<returnlist.num_macros[i]; j++)
            {
                top_pins = NO;
                bottom_pins = NO;
                aliases = NO;
                /***************************************************************
                 * See if this cell has any top or bottom connectors. *
                 * Also, see if it has any aliases. *
                 ***************************************************************/
                for(k=0; k<stdcell[instlist[count].index].num_pins; k++)
                {
                    if(stdcell[instlist[count].index].bot_conn[k])
                        bottom_pins = YES;
                    else if(stdcell[instlist[count].index].top_conn[k])
                        top_pins = YES;

if(instlist[count].alias[k][0] ISN_T '\0')
                        aliases = YES;
                }
                height += stdcell[instlist[count].index].height;
                if(stdcell[instlist[count].index].width > cell_width)
                    cell_width = stdcell[instlist[count].index].width;

count++;
            }
            height += (returnlist.num_macros[i] - 1) * YDELTA +
```

```
            (top_pins + bottom_pins) * YWIRE_LENGTH,
max_width += cell_width + (2 + aliases) * XWIRE_LENGTH;
if(height > max_height)
    max_height = height;
}
max_width += (returnlist.num_columns - 1) * XDELTA;
max_height += 2*YMARGIN;

fprintf(lafile, "V 12 VLSIlogicAssist\n");
fprintf(lafile, "T C\n");
fprintf(lafile, "L \"\"\n");
fprintf(lafile, "B 0 0 %d %d\n", max_width, max_height);
fprintf(lafile, "M 1073789791 1073777866 0 0\n");
fprintf(lafile, "F micejy\n");
fprintf(lafile, "D \"\" \"\" \"0\" \"0\" \"0\" \"0\" \"0\" \"0\" \"0\"\n");

/*****************
 * Add connectors *
 *****************/
num_inputs = 0;
num_outputs = 0;
icon_width = 150;
icon_height = 70;
for(i=0; i<num_conn; i++)
{
    /*************************************************************
     * If connector is input, place in on left of schematic and icon. *
     *************************************************************/
    if(connlist[i].type)
    {
        fprintf(lafile, "C %d %d %d %d \"%s\" normal LC B NSC %d %d 1\n",
            0, (max_height/3 - ((max_height/3) % 20))+20*num_inputs, j+1,
            7, 20+20*num_inputs, connlist[i].name,
            0, 20+20*num_inputs);
        fprintf(lafile, "N %d %d \"%s\" normal CB B\n",
            -30, (max_height/3 - ((max_height/3) % 20))+20*num_inputs, connlist[i].name);
        num_inputs++;
    }
    /*************************************************************
     * If connector is output, place in on right of schematic and icon. *
     *************************************************************/
    else
    {
        fprintf(lafile, "C %d %d %d %d \"%s\" normal RC B NSC %d %d 1\n",
            max_width, (max_height/3 - ((max_height/3) % 20))+20*num_outputs, i+1,
            icon_width-7, 20+20*num_outputs, connlist[i].name,
            icon_width, 20+20*num_outputs);
        fprintf(lafile, "N %d %d \"%s\" normal CB B\n",
            max_width+30, (max_height/3 - ((max_height/3) % 20))+20*num_outputs,
            connlist[i].name);
        num_outputs++;
    }
}
```

```
          if(num_inputs > num_outputs)
               icon_height += 20*num_inputs;
          else
               icon_height += 20*num_outputs;

/***************
      * Build Icon. *
      ***************/
          fprintf(lafile,  "v 4 *\n");
          fprintf(lafile,  "B 0 0 %d %d 1 0\n", icon_width, icon_height);
          fprintf(lafile,  "T %d %d \"@InstName\" normal CB B I\n", icon_width/2, icon_height-20);
          fprintf(lafile,  "T %d %d \"@@Label\" normal CB B L\n", icon_width/2, icon_height-35);
          fprintf(lafile,  "T %d %d \"t\" normal CB B T\n", icon_width/2, icon_height-50);
          fprintf(lafile,  "E\n");
     }

/**********************************************************************
 *  $I This section calculates and prints the inst info               *
 *                                                                    *
 *  I inst_name(lafile, returnlist, instlist, num_inst)               *
 *  note: the 2nd to last '*' above is for the display options        *
 *                   N = display instance name                        *
 *                   T = display cell name                            *
 *                   L = display instance label            "tag" color * * 0  *
 *                   C = display instance connectors                  *
 **********************************************************************/
bld_la_inst(lafile, returnlist, instlist, num_inst)
     int num_inst;
     ReturnType returnlist;
     InstanceType *instlist;
     FILE *lafile;
{
     int i, j;
     int column, count;
     int xloc, yloc;
     int bottom_pins, top_pins, aliases;
     char display_string[8];

xloc = XMARGIN + XWIRE_LENGTH;
     yloc = YMARGIN;
     column = 0;
     count = 1;

for(i=0; i<num_inst; i++)
     {
          /***************************************************
           * See if this cell has any top or bottom connectors. *
           * Also, see if it has any aliases.                   *
           ***************************************************/
          top_pins = NO;
          bottom_pins = NO;
          aliases = NO;
          for(j=0; j<stdcell[instlist[i].index].num_pins; j++)
```

```
        if(stdcell[instlist[i].index].bot_conn[j])
           bottom_pins = YES;
        else if(stdcell[instlist[i].index].top_conn[j])
           top_pins = YES;

if(instlist[i].alias[j][0] ISN_T '\0')
           aliases = YES;
     }

/*** display cell name if width >= 100 ***/
     if(stdcell[instlist[i].index].width > 99)
        strcpy(display_string, "TC");
     else if(stdcell[instlist[i].index].width > 79)
        strcpy(display_string, "C");
     else
        strcpy(display_string, "*");

fprintf(lafile, "I %s 1 %d %d \"[1a\]%s:portable\" \"\" %d %s * 0\n",
             instlist[i].inst_name, xloc, yloc+bottom_pins*YWIRE_LENGTH,
             ORIENT, instlist[i].name, INST_COLOR, display_string);

/*** Move xloc and yloc ***/
     if(count IS returnlist.num_macros[column])
     {
        column++;
        count = 1;
        xloc += (XDELTA + stdcell[instlist[i].index].width + (2 + aliases)*XWIRE_LENGTH);
        yloc = YMARGIN;
     }
     else
     {
        count++;
        yloc += (YDELTA + stdcell[instlist[i].index].height +
                (bottom_pins + top_pins)*YWIRE_LENGTH);
     }
  }
}

/**********************************************************************
*   $E  This routine calculates and prints the wire endpoint info.    *
*  ..                                                                 *
*       p  x  y  s                                                    *
*                                                                     *
*       note: connector statements and instances count as points      *
*                                                                     *
*   $S  This routine calculates and prints the segment info.          *
*   $N  It also names the segments.                                   *
*                                                                     *
*   s point1 point2 color SH                                          *
*   note: the SH refers to horizontal segments                        *
*             SV refers to vertical segments                          *
*             SHM refers to horizontal bus segments                   *
```

```
*   N x y "name" size justification B                                       *
*                                                                          *
*   if a point is an instance, use the following point syntax:             *
*        inst_point inst_name inst_conn_port "inst_conn_name"              *
*                                                                          *
*   note: segments must specify points in increasing x and y               *
*         node statements following a segment name that segment.           *
*         node statements following an endpoint name that endpoint.        *
****************************************************************************/
bld_la_segment(lafile,returnlist,instlist,num_inst,num_conn)
    int num_inst, num_conn;
    ReturnType   returnlist;
    InstanceType *instlist;
    FILE *lafile;
{
    int xloc, yloc;
    int xwire_offset, ywire_offset;
    int column, count, index, num_pins;
    int i, j;
    int bottom_pins, top_pins, aliases;

xloc = XMARGIN + XWIRE_LENGTH;
    yloc = YMARGIN;
    column = 0;
    count = 1;
    num_pins = 1;

/*** We need a point for every wire segment. ***/
for(i=0; i<num_inst; i++)
{
    index = instlist[i].index;
    /*** Check for top or bottom connectors on each instance. ***/
    top_pins = NO;
    bottom_pins = NO;
    aliases = NO;
    for(j=0; j<stdcell[index].num_pins; j++)
    {
        if(stdcell[index].bot_conn[j])
            bottom_pins = YES;
        else if(stdcell[index].top_conn[j])
            top_pins = YES;

if(instlist[i].alias[j][0] !SN_T' '\0')
            aliases = YES;
    } for(j=0; j<stdcell[index].num_pins; j++)
    {
/****************************************************************************
THIS IS A KLUDGE...NEED TO LOOK FOR MAX X AND MAX Y
AND ASSIGN OFFSETS BASED ON THAT.
****************************************************************************/
```

```
/*** Assign x,y for wire endpoint. ***/
if(stdcell[index].x_offset[j] IS
    stdcell[index].x_offset(stdcell[index].num_pins-1])
    xwire_offset = XWIRE_LENGTH;
else
    xwire_offset = -XWIRE_LENGTH;

if(stdcell[index].bot_conn[j])
{
    ywire_offset = -YWIRE_LENGTH;
    xwire_offset = 0;
}
else if(stdcell[index].top_conn[j])
{
    ywire_offset = YWIRE_LENGTH;
    xwire_offset = 0;
}
else
    ywire_offset = 0;

/*** Print the segment endpoint info. ***/
fprintf(lafile, "P %d %d S\n",
    xloc+stdcell[index].x_offset[j] + xwire_offset,
    yloc+bottom_pins*YWIRE_LENGTH+stdcell[index].y_offset[j] + ywire_offset);

/* Print out the segment info and name the segment. *
 * If pin is on right, it must be an output.        */
if(stdcell[instlist[i].index].x_offset[j] > 0)
{
    fprintf(lafile, "S %d %d %s %d \"%s\" %d SH\n",
        num_conn+i+1, instlist[i].inst_name, j+1,
        stdcell[instlist[i].index].pin_name[j], num_conn+num_inst+num_pins,
        WIRE_COLOR);
}
else
{
    fprintf(lafile, "S %d %d %s %d \"%s\" %d SH\n",
        num_conn+num_inst+num_pins, num_conn+i+1, instlist[i].inst_name, j+1,
        stdcell[instlist[i].index].pin_name[j],
        WIRE_COLOR);
}
/*** Name the segment. ***/
fprintf(lafile, "N %d %d \"%s\" normal CB B\n",
    xloc+stdcell[index].x_offset[j] + xwire_offset/2,
    yloc+bottom_pins*YWIRE_LENGTH+stdcell[index].y_offset[j] +
    ywire_offset + 5, instlist[i].pin_names[j]);
num_pins++;

/*** Now handle aliases (if any). ***/
if(instlist[i].alias[j][0] ISN_T '\0')
{
    if(stdcell[instlist[i].index].x_offset[j] > 0)
```

```
              {
                  fprintf(lafile, "P %d %d S\n",
                      xloc+stdcell[index].x_offset[j] + xwire_offset - XWIRE_LENGTH,
                      yloc+bottom_pins*YWIRE_LENGTH+stdcell[index].y_offset[j] + ywire_offset);
                  fprintf(lafile, "1 alias %d 1 %d %d 0 \"[la\\]alias\" \"\" %d * * 0\n",
                      num_pins, xloc+stdcell[index].x_offset[j] + xwire_offset,
                      yloc+bottom_pins*YWIRE_LENGTH+stdcell[index].y_offset[j] + ywire_offset, INST_COLOR);
                  fprintf(lafile, "S %d %d alias_%d 1 \"C1\" %d SH\n",
                      num_conns+num_inst+num_pins+3*i, num_conns+num_inst+num_pins+3*i+2, i, WIRE_COLOR);
                  fprintf(lafile, "N %d %d \"%s\" normal CB B\n", 4030, 20*i, joinlist[i].name1);
                  fprintf(lafile, "S %d %d alias_%d 1 \"C1\" %d SH\n",
                      num_conns+num_inst+num_pins+3*i+2, i, num_conns+num_inst+num_pins+3*i+1, WIRE_COLOR);
                  fprintf(lafile, "N %d %d \"%s\" normal CB B\n", 4130, 20*i, joinlist[i].name2);
              } if(count IS returnlist.num_macros[column])
              {
                  xloc += (XDELTA + stdcell[index].width + (2 + aliases)*XWIRE_LENGTH);
                  yloc = YMARGIN;
                  column++;
                  count = 1;
              }
              else
              {
                  count++;
                  yloc += (YDELTA + stdcell[index].height + (bottom_pins + top_pins)*YWIRE_LENGTH);
              }
          }
*/
      } for(i=0; i<num_joins; i++)
      {
          fprintf(lafile, "P %d %d S\n",    4000, 20*i);
          fprintf(lafile, "P %d %d S\n",    4200, 20*i);
          fprintf(lafile, "1 alias %d 1 %d %d 0 \"[la\\]alias\" \"\" %d * * 0\n",
              1, 4100, 20*i, INST_COLOR);
          fprintf(lafile, "S %d %d alias_%d 1 \"C1\" %d SH\n",
              num_conns+num_inst+num_pins+3*i, num_conns+num_inst+num_pins+3*i+2, i, WIRE_COLOR);
          fprintf(lafile, "N %d %d \"%s\" normal CB B\n", 4030, 20*i, joinlist[i].name1);

fprintf(lafile, "S %d %d alias_%d 1 \"C1\" %d SH\n",
              num_conns+num_inst+num_pins+3*i+2, i, num_conns+num_inst+num_pins+3*i+1, WIRE_COLOR);
          fprintf(lafile, "N %d %d \"%s\" normal CB B\n", 4130, 20*i, joinlist[i].name2);
      }
*/
} allocate_instlist(ilist, num_inst, max_inst)
    int *max_inst, *num_inst;
    InstanceType **ilist;
{
```

```
    int k, m;
    InstanceType *new_ilist;
    new_ilist = *ilist;

if(*num_inst >= *max_inst || *num_inst IS 0)
    {
        if(*num_inst >= *max_inst)
            *max_inst += MEM_ALLOC_INCR;

zalloc(new_ilist, *max_inst, InstanceType);
        for(m=*num_inst; m<*max_inst; m++)
        {
            for(k=0; k<MAXCONN; k++)
                new_ilist[m].alias[k][0] = '\0';
        }

*ilist = new_ilist;
    }
}
/* General definitions */ define IS          ==
define ISN_T       !=
#define NOT         !

#define TRUE        1
#define FALSE       0
#define YES         TRUE
#define NO          FALSE
#define MAXCONN     20
define MAXNAME     40 define XMARGIN         120
define YMARGIN         50
#define XDELTA          80
#define YDELTA          50
#define XWIRE_LENGTH    50
define YWIRE_LENGTH    30 define MEM_ALLOC_INCR 64 define VSS 1
define VDD 2 define zalloc(buf, count, type) \
    ( if (buf) buf = (type *) realloc(buf, (count) * sizeof(type)); \
      else     buf = (type *) calloc(count, sizeof(type)); \
      if ( buf IS NULL ) \
      { \
          printf("ZALLOC - out of memory\n"); \
          exit (0); \
      } \
    }
```

```c
extern FILE *open_file();

typedef struct {
    char *name;
    int  width;
    int  height;
    int  num_gates;
    int  num_pins;
    int  x_offset[MAXCONN];
    int  y_offset[MAXCONN];
    int  top_conn[MAXCONN];
    int  bot_conn[MAXCONN];
    char *pin_name[MAXCONN];
    int  pin_id[MAXCONN];
} StdCellScType;

typedef struct {
    char name[MAXNAME];
    int  type;  /* 1 = input, 0 = output */
} ConnectorType;

typedef struct {
    char name[MAXNAME];
    char inst_name[MAXNAME];
    int  index;
    int  cardinality;
    char pin_names[MAXCONN][MAXNAME];
    char alias[MAXCONN][MAXNAME];
} InstanceType;

typedef struct {
    int  *num_macros;            /* number of macros per column in sc */
    int  num_columns;            /* total number of columns */
    int  max_columns;
} ReturnType;

typedef struct {
    char name[MAXNAME];
} NameType;
/* Define VTI connector names and numbers for specific cells */ define NUM_SC_ELEMENTS 57
static StdCellScType stdcell[] = {
#define PCHANNEL 0
    "pchanneltransistor", 20, 50, 0, 3,
    {   0,   30,   30   },
    {   0,   20,  -20   },
    {   0,    1,    0   },
    {   0,    0,    1   },
    { "GATE", "SOURCE", "DRAIN" },
    {   1,    2,    3   },
#define NCHANNEL 1
    "nchanneltransistor", 20, 50, 0, 3,
```

```
         [  0,  30,   30 ] ],
         [  0, -20,   20 ] ],
         [  0,   0,    1 ] ],
         [  0,   1,    0 ] ],
         "GATE", "SOURCE", "DRAIN" ],
            1,    2,    3  ],
#define AND2 2
"an02d1", 60,  30,  2, 3,
         [  0,  20,   60 ] ],
         [  0,   0,   10 ] ],
         [  0,   0,    0 ] ],
         [  0,   0,    0 ] ],
         "A2", "A1", "Z" ],
            1,    2,    3  ],
#define AND3 3
"an03d1", 60,  30, 2, 4,
         [  0,   0,   30,  60 ] ],
         [  0,  10,    0,  10 ] ],
         [  0,  20,    0,   0 ] ],
         [  0,   0,    0,   0 ] ],
         "A3", "A2", "A1", "Z" ],
            1,    2,    3,   4  ],
#define AND4 4
"an04d1", 60,  40, 3, 5,
         [  0,  20,    0,   0,  60 ] ],
         [  0,  10,    0,  30,  20 ] ],
         [  0,  20,    0,   0,   0 ] ],
         [  0,   0,    0,   0,   0 ] ],
         "A4", "A3", "A2", "A1", "Z" ],
            1,    2,    3,   4,   5  ],
#define AND5 5
"an05d1", 60,  50, 3, 6,
         [  0,  20,    0,   0,   0,  60 ] ],
         [  0,  10,    0,  30,  40,  20 ] ],
         [  0,  20,    0,   0,   0,   0 ] ],
         [  0,   0,    0,   0,   0,   0 ] ],
         "A5", "A4", "A3", "A2", "A1", "Z" ],
            1,    2,    3,   4,   5,   6  ],
#define AND6 6
"an06d1", 60,  60, 4, 7,
         [  0,  20,    0,   0,   0,   0,  60 ] ],
         [  0,  10,    0,  30,  40,  50,  30 ] ],
         [  0,  20,    0,   0,   0,   0,   0 ] ],
         [  0,   0,    0,   0,   0,   0,   0 ] ],
         "A6", "A5", "A4", "A3", "A2", "A1", "Z" ],
            1,    2,    3,   4,   5,   6,   7  ],
#define AND7 7
"an07d1", 60,  70, 4, 8,
         [  0,  20,    0,   0,   0,   0,   0,  60 ] ],
         [  0,  10,    0,  30,  40,  50,  60,  30 ] ],
         [  0,  20,    0,   0,   0,   0,   0,   0 ] ],
         [  0,   0,    0,   0,   0,   0,   0,   0 ] ],
         "A7", "A6", "A5", "A4", "A3", "A2", "A1", "Z" ],
            1,    2,    3,   4,   5,   6,   7,   8  ],
```

```
#define AND8 8
"an08d1", 60, 80, 5, 9,
( 0,  0,  0,  0,  0,  0,  0,  0,  0, 60 ],
( 0, 10,  0, 20, 30,  0, 40,  0, 50,  0, 60,  0, 70,  0, 60, 40 ],
( 0,  0,  0,  0,  0,  0,  0,  0,  0,  0,  0,  0,  0,  0,  0,  0 ],
"A8", "A7", "A6", "A5", "A4", "A3", "A2", "A1", "Z",
   1,   2,    3,    4,    5,    6,    7,    8,   9 ], define OR2 9
"or02d1", 60, 30, 2, 3,
( 0,  0,  0, 60 ],
( 0, 20,  0, 10 ],
( 0,  0,  0,  0 ],
"A2", "A1", "Z",
   1,   2,   3 ], define OR3 10
"or03d1", 60, 30, 2, 4,
( 0,  0,  0, 4, 60 ],
( 0, 10,  0, 20, 60, 10 ],
( 0,  0,  0,  0,  0,  0 ],
"A3", "A2", "A1", "Z",
   1,   2,   3,   4 ], define OR4 11
"or04d1", 60, 40, 3, 5,
( 0,  0,  0, 5, 60 ],
( 0, 10,  0, 20, 30,  0, 60, 20 ],
( 0,  0,  0,  0,  0,  0,  0,  0 ],
"A4", "A3", "A2", "A1", "Z",
   1,   2,   3,   4,   5 ], define OR5 12
"or05d1", 60, 50, 3, 6,
( 0,  0,  0, 6, 60 ],
( 0, 10,  0, 20,  0, 30,  0, 40,  0, 60, 30 ],
( 0,  0,  0,  0,  0,  0,  0,  0,  0,  0,  0 ],
"A5", "A4", "A3", "A2", "A1", "Z",
   1,   2,   3,   4,   5,   6 ], define OR6 13
"or06d1", 60, 60, 4, 7,
( 0,  0,  0, 7, 60 ],
( 0, 10,  0, 20,  0, 30,  0, 40,  0, 50,  0, 60, 40 ],
( 0,  0,  0,  0,  0,  0,  0,  0,  0,  0,  0,  0,  0 ],
"A6", "A5", "A4", "A3", "A2", "A1", "Z",
   1,   2,   3,   4,   5,   6,   7 ], define OR7 14
"or07d1", 60, 70, 4, 8,
( 0,  0,  0,  0,  0,  0,  0,  0,  0, 60 ],
( 0, 10,  0, 20, 30,  0, 40,  0, 50,  0, 60,  0, 60, 30 ],
( 0,  0,  0,  0,  0,  0,  0,  0,  0,  0,  0,  0,  0,  0 ],
```

```
    [ "A7",  "A6",  "A5",  "A4",  "A3",  "A2",  "A1",  "Z"  ],
      1,     2,     3,     4,     5,     6,     7,    8  ],
#define OR8 15
"or08d1", 60, 80, 5, 9,
    ( 0,    0,    0,    0,    0,    0,    0,   60 ],
    ( 0,   10,   20,   30,   40,   50,   60,   70,    0 ],
    ( 0,    0,    0,    0,    0,    0,    0,    0 ],
    [ "A8", "A7", "A6", "A5", "A4", "A3", "A2", "A1", "Z" ],
      1,    2,    3,    4,    5,    6,    7,    8,   9  ], define NAND2 16
"nd02d1", 60, 30, 1, 3,
    ( 0,    0,   60 ],
    ( 0,   20,   10 ],
    ( 0,    0,    0 ],
    [ "A2", "A1", "ZN" ],
      1,    2,    3  ], define NAND3 17
"nd03d1", 60, 30, 2, 4,
    ( 0,    0,   60 ],
    ( 0,   10,    0 ],
    ( 0,   20,    0 ],
    ( 0,    0,    0 ],
    [ "A3", "A2", "A1", "ZN" ],
      1,    2,    3,   4  ], define NAND4 18
"nd04d1", 60, 40, 2, 5,
    ( 0,    0,   60 ],
    ( 0,   10,   20 ],
    ( 0,   20,    0 ],
    ( 0,   30,    0 ],
    ( 0,    0,    0 ],
    [ "A4", "A3", "A2", "A1", "ZN" ],
      1,    2,    3,    4,   5  ], define NAND5 19
"nd05d1", 60, 50, 3, 6,
    ( 0,    0,    0,   60 ],
    ( 0,   10,   20,   30 ],
    ( 0,   20,    0,    0 ],
    ( 0,   30,    0,    0 ],
    ( 0,   40,    0,    0 ],
    ( 0,    0,    0,    0 ],
    [ "A5", "A4", "A3", "A2", "A1", "ZN" ],
      1,    2,    3,    4,    5,   6  ], define NAND6 20
"nd06d1", 60, 60, 3, 7,
    ( 0,    0,    0,   60 ],
    ( 0,   10,   20,    0 ],
    ( 0,   20,    0,   50 ],
    ( 0,   30,    0,    0 ],
    ( 0,   40,    0,    0 ],
    ( 0,   50,    0,    0 ],
    ( 0,    0,    0,    0 ],
    [ "A6", "A5", "A4", "A3", "A2", "A1", "ZN" ],
      1,    2,    3,    4,    5,    6,   7  ], define NAND7 21
"nd07d1", 60, 70, 4, 8,
    ( 0,    0,    0,    0,   60 ],
    ( 0,   10,   20,   30,    0 ],
    ( 0,    0,   40,    0,   50,    0,   60,   30 ],
```

```
#define NAND8 22
    "nd08d1", 60, 80, 4, 9,
    (    0,    0,   10,    0,   20,    0,   30,    0,   40,    0,   50,    0,   60,    0,   70,    0,    0,   0 ],
    (    0,    0,    0,    0,    0,    0,    0,    0,    0,    0,    0,    0,    0,    0,    0,    0,    0,   0 ],
    [ "A8", "A7", "A6", "A5", "A4", "A3", "A2", "A1",   "ZN" ],
      1,    2,    3,    4,    5,    6,    7,    8,    9 ), define NOR2 23
    "nr02d1", 60, 30, 1, 3,
    (    0,   20,    0,   60,    0,    0 ],
    (    0,    0,    0,   10,    0,    0 ],
    [ "A2", "A1", "ZN" ],
      1,    2,    3 ), define NOR3 24
    "nr03d1", 60, 30, 2, 4,
    (    0,   10,    0,   20,    0,   60,    0,    0 ],
    (    0,    0,    0,    0,    0,   10,    0,    0 ],
    [ "A3", "A2", "A1", "ZN" ],
      1,    2,    3,    4 ), define NOR4 25
    "nr04d1", 60, 40, 2, 5,
    (    0,   10,    0,   20,    0,   30,    0,   60,    0,    0 ],
    (    0,    0,    0,    0,    0,    0,    0,   20,    0,    0 ],
    [ "A4", "A3", "A2", "A1", "ZN" ],
      1,    2,    3,    4,    5 ), define NOR5 26
    "nr05d1", 60, 50, 3, 6,
    (    0,   10,    0,   20,    0,   30,    0,   40,    0,    0,   60,    0,    0 ],
    (    0,    0,    0,    0,    0,    0,    0,    0,    0,    0,   30,    0,    0 ],
    [ "A5", "A4", "A3", "A2", "A1", "ZN" ],
      1,    2,    3,    4,    5,    6 ), define NOR6 27
    "nr06d1", 60, 60, 3, 7,
    (    0,   10,    0,   20,    0,   30,    0,   40,    0,   50,    0,    0,   60,    0,    0 ],
    (    0,    0,    0,    0,    0,    0,    0,    0,    0,    0,    0,    0,   40,    0,    0 ],
    [ "A6", "A5", "A4", "A3", "A2", "A1", "ZN" ],
      1,    2,    3,    4,    5,    6,    7 ), define NOR7 28
    "nr07d1", 60, 70, 4, 8,
```

```
#define NOR8 29
"nr08d1", 60, 80, 4, 9,
{ 0,  0,  0,  0,  0,  0,  0,  0,  0,  0,  0, 60 },
{ 0, 10, 20, 30, 40,  0,  0, 50, 60, 30 },
{ 0,  0,  0,  0,  0,  0,  0,  0,  0,  0 },
{ "A7", "A6", "A5", "A4", "A3", "A2", "A1", "ZN" },
  1,  2,  3,  4,  5,  6,  7,  8 }, define XNOR 30
"xn02d1", 60, 30, 3, 3,
{ 0,  0,  0,  0,  0,  0, 60 },
{ 0, 20, 10,  0,  0, 40, 60, 70,  0 },
{ 0,  0,  0,  0,  0,  0,  0, 40,  0 },
{ "A8", "A7", "A6", "A5", "A4", "A3", "A2", "A1", "ZN" },
  1,  2,  3,  4,  5,  6,  7,  8,  9 }, define XOR 31
"xo02d1", 60, 30, 3, 3,
{ 0,  0,  0,  0, 60 },
{ 0, 20, 10,  0,  0 },
{ 0,  0,  0,  0,  0 },
{ "A2", "A1", "Z" },
  1,  2,  3 }, define DFF 32
"dfntnb", 80, 100, 7, 4,
{ 0,  0, 80,  0,  0,  0, 80 },
{ 0, 40,  0, 20,  0, 20,  0 },
{ 0,  0,  0,  0,  0,  0,  0 },
{ "CP", "D", "QN", "Q" },
  1,  2,  3,  4 }, define DFFCLR 33
"dfptnb", 80, 110, 8, 5,
{ 40,  0,  0,  0,  0,  0, 80,  0 },
{100,  0, 40,  0,  0, 20,  0,  0 },
{  1,  0,  0,  0,  0,  0,  0,  0 },
{ "SDN", "CP", "D", "QN", "Q" },
  1,  2,  3,  4,  5 }, define LAT 34
"lantnb", 80, 100, 5, 4,
{ 0,  0,  0,  0, 80 },
{ 0, 40,  0, 20,  0 },
{ 0,  0,  0,  0,  0 },
{ "E", "D", "QN", "Q" },
  1,  2,  3,  4 },
```

```
#define LATN 35
"lanfnb", 80, 100, 5, 4,
{   0,   0,  80,  80 ],
{   0,  40,   0,  20 ],
{   0,   0,   0,   0 ],
{ "EN", "D", "QN", "Q" ],
    1,   2,   3,   4,
#define MUX2 36
"mx21d1", 60, 90, 3, 4,
{ -30,   0,   0,  60 ],
{ -30,   0,  40,  20 ],
{   0,   0,   0,   0 ],
{ "S", "I1", "I0", "Z" ],
    1,   2,   3,   4,
#define MUX4 37
"mx41d1", 80, 110, 7, 7,
{  50,  30,   0,   0,  40,   0,  80 ],
{ -30, -30,   0,  20,   0,  60,  30 ],
{   0,   0,   0,   0,   0,   0,   0 ],
{ "S1", "S0", "I3", "I2", "I1", "I0", "Z" ],
    1,   2,   3,   4,   5,   6,   7
#define INV1 38
"in01d1", 50, 20, 1, 2,
{   0,  50 ],
{   0,   0 ],
{   0,   0 ],
{ "I", "ZN" ],
    1,   2 ],
#define INV2 39
"in01d2", 50, 20, 1, 2,
{   0,  50 ],
{   0,   0 ],
{   0,   0 ],
{ "I", "ZN" ],
    1,   2 ],
#define INV3 40
"in01d3", 50, 20, 2, 2,
{   0,  50 ],
{   0,   0 ],
{   0,   0 ],
{ "I", "ZN" ],
    1,   2 ],
#define BUF1 41
"ni01d1", 50, 20, 1, 2,
{   0,  50 ],
{   0,   0 ],
{   0,   0 ],
```

```
#define BUF2 42
  "ni01d2", 50, 20, 2, 2,
  [ 0, 50 ],
  [ 0, 0 ],
  [ 0, 0 ],
  [ "I", "Z" ],
  1, 2 ],
#define BUF3 43
  "ni01d3", 50, 20, 2, 2,
  [ 0, 50 ],
  [ 0, 0 ],
  [ 0, 0 ],
  [ "I", "Z" ],
  1, 2 ],
#define ADD2 44
  "ad02d1", 80, 100, 18, 8,
  [ 0, 0, 0, 0, 80, 80 ],
  [ 0, 20, 40, 60, 80, 40, 80 ],
  [ 0, 0, 0, 0, 0, 0, 0 ],
  [ 0, 0, 0, 0, 0, 0, 0 ],
  [ "CI", "B1", "A1", "B0", "A0", "CO", "S1", "S0" ],
  1, 2, 3, 4, 5, 6, 7, 8 ],
#define ADD1 45
  "ad01d1", 80, 100, 10, 5,
  [ 0, 0, 0, 80, 80 ],
  [ 0, 40, 80, 0, 80 ],
  [ 0, 0, 0, 0, 0 ],
  [ 0, 0, 0, 0, 0 ],
  [ "CI", "B", "A", "CO", "S" ],
  1, 2, 3, 4, 5 ],
#define WEIGHT 46
  "weight", 30, 20, 0, 1,
  [ 10 ],
  [ 25 ],
  [ 1 ],
  [ 0 ],
  [ "NET" ],
  1 ],
#define AO1 47
  "ao01d1", 110, 80, 2, 5,
  [ 0, 0, 0, 0, 110 ],
  [ 0, 20, 40, 60, 30 ],
  [ 0, 0, 0, 0, 0 ],
  [ 0, 0, 0, 0, 0 ],
  [ "B2", "B1", "A2", "A1", "ZN" ],
  1, 2, 3, 4, 5 ],
#define OA1 48
  "oa01d1", 110, 80, 2, 5,
  [ 0, 0, 0, 0, 110 ],
  [ 0, 20, 40, 60, 30 ],
```

```
      {   0,   0,   0,   0,   0   } ],
      {   0,   0,   0,   0,   0   } ],
      { "B2", "B1", "A2", "A1", "ZN" } ],
         1,   2,   3,   4,   5 };
#define OA2 49
"oa02d1", 110, 80, 3, 7,
      {   0,  10,  20,  40,  50,   0,   0, 110 } ],
      {   0,   0,   0,   0,  60,  60,  30 } ],
      {   0,   0,   0,   0,   0,   0,   0 } ],
      { "B3", "B2", "B1", "A3", "A2", "A1", "ZN" } ],
         1,   2,   3,   4,   5,   6,   7 };
#define OA3 50
"oa03d1", 110, 110, 3, 6,
      {   0,  20,  40,  60,  80,   0, 110 } ],
      {   0,   0,   0,   0,  50,  50 } ],
      {   0,   0,   0,   0,   0,   0 } ],
      { "C", "B2", "B1", "A2", "A1", "ZN" } ],
         1,   2,   3,   4,   5 };
#define OA4 51
"oa04d1", 110, 70, 2, 4,
      {   0,   0,  20,  40,   0, 110 } ],
      {   0,   0,   0,   0,  10 } ],
      {   0,   0,   0,   0,   0 } ],
      { "B", "A2", "A1", "ZN" } ],
         1,   2,   3,   4 };
#define OA5 52
"oa05d1", 110, 80, 2, 5,
      {   0,   0,  20,  40,   0,  60,   0, 110 } ],
      {   0,   0,   0,   0,   0,  60,  30 } ],
      {   0,   0,   0,   0,   0,   0,   0 } ],
      { "C", "B", "A2", "A1", "ZN" } ],
         1,   2,   3,   4,   5 };
#define TRI1 53
"nt01d1", 50, 60, 2, 3,
      {   0,  20,  50 } ],
      {   0, -30,   0 } ],
      {   0,   0,   0 } ],
      { "I", "OE", "Z" } ],
         1,   2,   3 };
#define TRI2 54
"nt01d2", 50, 60, 3, 3,
      {   0,  20,  50 } ],
      {   0, -30,   0 } ],
      {   0,   1,   0 } ],
      { "I", "OE", "Z" } ],
         2,   1,   3 };
#define TRI3 55
"nt01d3", 50, 60, 4, 3,
```

```
    {   0,   20,   50  },
    {   0,  -30,    0  },
    {   0,    0,    0  },
    {   0,    1,    0  },
    {  "I", "OE",  "Z" },
    {   2,    1,    3  },
#define RPTR 56
    "rp0ldl", 70, 90, 3, 1,
    {   0  },
    {   0  },
    {   0  },
    {   0  },
    {  "Z" },
    {   1  }
  };.
```

We claim:

1. An integrated circuit which implements the multiplication of a multiplicand and a multiplier in two's complement format, the integrated circuit comprising:
   a plurality of logical gates, arranged to receive the multiplicand and the multiplier and to generate summands for two's complement multiplication, the summands arranged in columns;
   a reduction means, coupled to the plurality of logical gates, for reducing the summands generated by the plurality of logical gates so there is a maximum of two summands in each column, the reduction means including a plurality of adders arranged in rows so that each row of adders reduces a maximum number of summands in each column to a next lower predetermined number stage; and,
   a final adder row which performs a final addition on summands remaining after the summands have been reduced by the reduction means.

2. An integrated circuit as in claim 1 wherein a lowest predetermined number stage is two and wherein a predetermined number stage $S_j$, other than the lowest predetermined number stage, is calculated by a next lower number stage $S_{j-1}$ using a formula: $S_j = S_{j-1} + \text{int}(S_{j-1}/2)$.

3. A method for performing multiplication of a multiplicand by a multiplier, the multiplicand and the multiplier being in two's complement numbers on an integrated circuit, the method comprising the steps of:
   (a) receiving, by a plurality of logical gates, the multiplicand and the multiplier;
   (b) generating, by the plurality of logical gates, summands for two's complement multiplication, the summands arranged in columns;
   (c) reducing the summands generated by the plurality of logical gates so there is a maximum of two summands in each column, the reduction being done by a plurality of adders arranged in rows so that each row of adders reduces a maximum number of summands in each column to a next lower predetermined number stage; and,
   (d) performing a final addition on summands remaining after the summands have been reduced.

4. A method as in claim 3 wherein, in step (c), a lowest predetermined number stage is two and wherein a predetermined number stage $S_j$, other than the lowest predetermined number stage, is calculated by a next lower number stage $S_{j-1}$ using a formula: $S_j = S_{j-1} + \text{int}(S_{j-1}/2)$ 5. An integrated circuit which implements the multiplication of a multiplicand and a multiplier, the integrated circuit comprising:
   a plurality of logical gates, arranged to receive the multiplicand and the multiplier and to generate summands, the summands arranged in columns;
   a reduction means, coupled to the plurality of logical gates, for reducing the summands generated by the plurality of logical gates so there is a maximum of two summands in each column, the reduction means including a plurality of adders arranged in rows so that each row of adders reduces a maximum number of summands in each column to a next lower predetermined number stage;
   an adder which performs a final addition on summands remaining after the summands have been reduced by the reduction means; and,
   mode changing means, coupled to the plurality of logical gates, for, when a mode bit is in a first state, causing the plurality of logical gates to generate summands for multiplication of unsigned magnitude numbers, and when the mode bit is in a second state, causing the plurality of logical gates to generate summands for multiplication of two's complement numbers.

6. An integrated circuit as in claim 5 wherein a lowest predetermined number stage is two and wherein a predetermined number stage $S_j$, other than the lowest predetermined number stage, is calculated by a next lower number stage $S_{j-1}$ using a formula: $S_j = S_{j-1} + \text{int}(S_{j-1}/2)$.

* * * * *